US012100630B2

(12) United States Patent
Marbell et al.

(10) Patent No.: US 12,100,630 B2
(45) Date of Patent: Sep. 24, 2024

(54) PACKAGED RF POWER DEVICE WITH PCB ROUTING OUTSIDE PROTECTIVE MEMBER

(71) Applicant: MACOM Technology Solutions Holdings, Inc., Lowell, MA (US)

(72) Inventors: Marvin Marbell, Morgan Hill, CA (US); Melvin Nava, Morgan Hill, CA (US); Jeremy Fisher, Raleigh, NC (US); Alexander Komposch, Morgan Hill, CA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 17/097,294

(22) Filed: Nov. 13, 2020

(65) Prior Publication Data

US 2022/0157671 A1    May 19, 2022

(51) Int. Cl.
*H01L 23/047* (2006.01)
*H01L 21/48* (2006.01)
*H01L 23/66* (2006.01)

(52) U.S. Cl.
CPC ........ *H01L 23/047* (2013.01); *H01L 21/4817* (2013.01); *H01L 23/66* (2013.01);
(Continued)

(58) Field of Classification Search
CPC ... H01L 23/047; H01L 21/4817; H01L 23/66; H01L 2223/6611; H01L 2223/6655; H01L 24/01; H01L 24/45; H01L 2224/45144; H01L 2224/48091; H01L 2224/49175; H01L 2224/73265; H01L 2924/181; H01L 2924/19105; H01L 23/13; H01L 23/36;
(Continued)

(56) References Cited

U.S. PATENT DOCUMENTS 5,192,987 A    3/1993    Khan et al.
5,210,051 A    5/1993    Carter
(Continued)

FOREIGN PATENT DOCUMENTS

JP    H10242716 A    9/1998
JP    2000058715 A    2/2000
(Continued)

OTHER PUBLICATIONS

Notification of Transmittal of the International Search Report and the Written Opinion of the International Searching Authority, or the Declaration, in corresponding PCT Application No. PCT/US2021/058582 (Feb. 16, 2022).

*Primary Examiner* — Duy T Nguyen
(74) *Attorney, Agent, or Firm* — Myers Bigel, P.A.

(57) ABSTRACT

A radio frequency (RF) transistor amplifier includes a package submount, a package frame comprising an electrically insulating member and one or more conductive layers on the package submount and exposing a surface thereof, a transistor die on the surface of the package submount and comprising respective terminals that are electrically connected to the package frame, a protective member covering the transistor die, and one or more electrical components that are attached to the package frame outside the protective member. Related RF power device packages and fabrication methods are also discussed.

32 Claims, 8 Drawing Sheets

(52) U.S. Cl.
CPC ............. *H01L 2223/6611* (2013.01); *H01L 2223/6655* (2013.01)

(58) Field of Classification Search
CPC ... H01L 2223/6644; H01L 2224/48195; H01L 24/49; H01L 25/16; H05K 1/0243; H05K 2201/10166; H05K 2201/10363; H05K 2201/10636; H05K 1/021
USPC ......................................................... 257/695
See application file for complete search history.

(56) References Cited

U.S. PATENT DOCUMENTS

| | | | |
|---|---|---|---|
| 5,296,395 A | 3/1994 | Khan et al. | |
| 5,393,993 A | 2/1995 | Edmond et al. | |
| 5,523,589 A | 6/1996 | Edmond et al. | |
| 6,313,524 B1 * | 11/2001 | Pueschner | H05K 3/3426 29/841 |
| 6,316,793 B1 | 11/2001 | Sheppard et al. | |
| 6,455,925 B1 * | 9/2002 | Laureanti | H01L 23/66 257/E23.071 |
| 6,548,333 B2 | 4/2003 | Smith | |
| 7,030,428 B2 | 4/2006 | Saxler | |
| 7,045,404 B2 | 5/2006 | Sheppard et al. | |
| 7,544,963 B2 | 6/2009 | Saxler | |
| 7,548,112 B2 | 6/2009 | Sheppard | |
| 7,592,211 B2 | 9/2009 | Sheppard et al. | |
| 7,615,774 B2 | 11/2009 | Saxler | |
| 7,709,269 B2 | 5/2010 | Smith et al. | |
| 8,049,252 B2 | 11/2011 | Smith et al. | |
| 8,120,064 B2 | 2/2012 | Parikh et al. | |
| 9,293,407 B2 | 3/2016 | Komposch et al. | |
| 9,979,361 B1 * | 5/2018 | Mangaonkar | H03F 3/213 |
| 2001/0038310 A1 * | 11/2001 | Olofsson | H01L 23/36 257/E23.101 |
| 2004/0080044 A1 * | 4/2004 | Moriyama | H01L 23/49838 257/691 |
| 2010/0246152 A1 * | 9/2010 | Lin | H01L 23/481 361/783 |
| 2011/0007478 A1 * | 1/2011 | Takahashi | H01L 23/3121 361/721 |
| 2011/0141639 A1 * | 6/2011 | Dijkhuis | H01L 27/0248 361/56 |
| 2014/0044656 A1 * | 2/2014 | Goralczyk | A61K 8/046 424/59 |
| 2014/0239471 A1 * | 8/2014 | Khunpukdee | H01L 24/97 257/676 |
| 2015/0303881 A1 * | 10/2015 | Blednov | H03F 1/086 330/289 |
| 2019/0103365 A1 | 4/2019 | Singh et al. | |
| 2019/0385934 A1 * | 12/2019 | Kodama | H01L 23/481 |
| 2020/0366244 A1 * | 11/2020 | Roiz | H03F 1/56 |

FOREIGN PATENT DOCUMENTS

| | | |
|---|---|---|
| JP | 2003517212 A | 5/2003 |
| JP | 2012227347 A | 11/2012 |
| WO | 2005024946 A1 | 3/2005 |
| WO | 2017140737 A1 | 8/2017 |

* cited by examiner

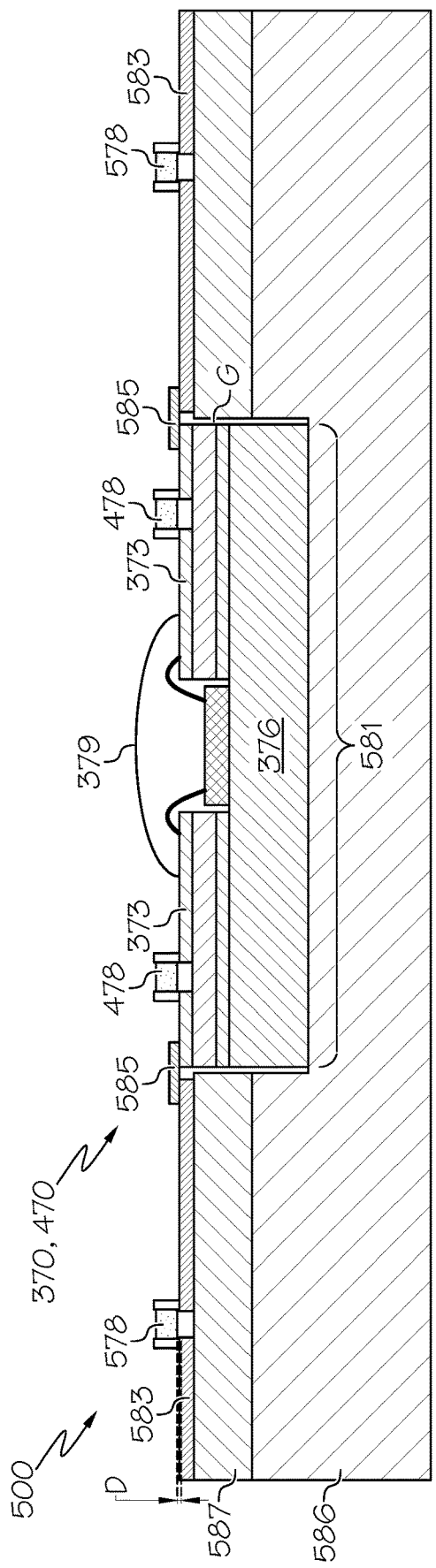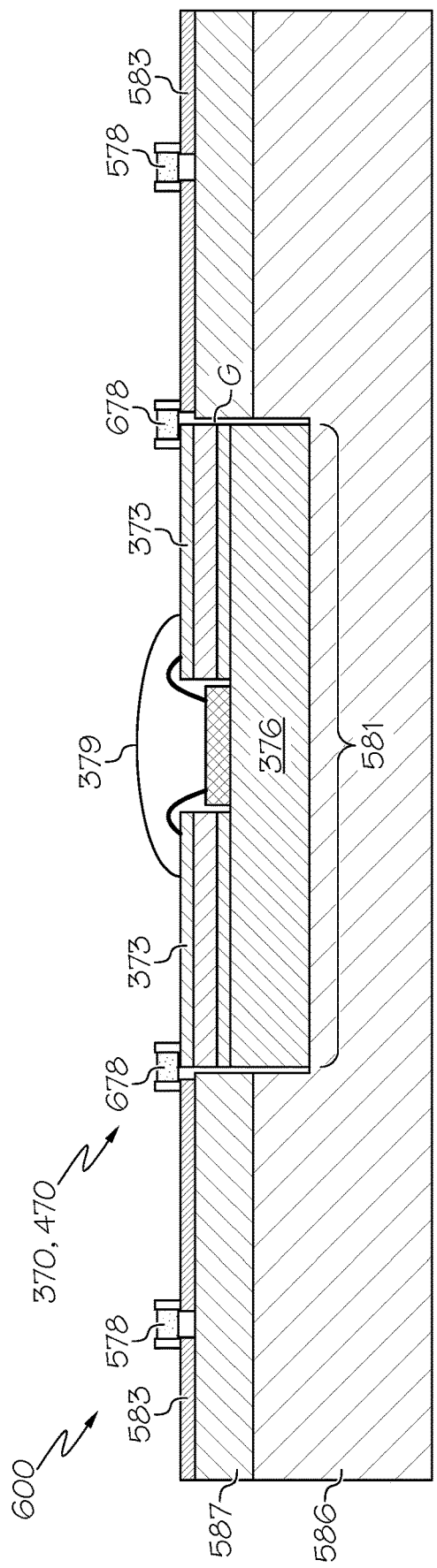

PACKAGED RF POWER DEVICE WITH PCB ROUTING OUTSIDE PROTECTIVE MEMBER

FIELD

The present disclosure relates generally to radio frequency ("RF") transistor devices and, more particularly, to packaged RF transistor devices.

BACKGROUND

Electrical circuits requiring high power handling capability while operating at high frequencies, such as UHF (0.3-1 GHz), L-Band (1-2 GHz), R-band (1.7-2.6 GHz), S-band (2-4 GHz) and X-band (8-12 GHz), have in recent years become more prevalent. In particular, there may be high demand for RF power amplifiers that are used to amplify RF signals at radio (including microwave) frequencies. These RF power amplifiers may need to exhibit high reliability, good linearity and handle high output power levels.

RF power amplifiers may be implemented in silicon or using wide bandgap semiconductor materials (i.e., having a band-gap greater than 1.40 eV), such as silicon carbide ("SiC") and Group III nitride materials. As used herein, the term "Group III nitride" refers to those semiconducting compounds formed between nitrogen and the elements in Group III of the periodic table, usually aluminum (Al), gallium (Ga), and/or indium (In). The Group III elements can combine with nitrogen to form binary (e.g., GaN), ternary (e.g., AlGaN, AlInN), and quaternary (e.g., AlInGaN) compounds. These compounds have empirical formulas in which one mole of nitrogen is combined with a total of one mole of the Group III elements.

Silicon-based RF power amplifiers are typically implemented using laterally diffused metal oxide semiconductor ("LDMOS") transistors. Silicon LDMOS RF power amplifiers can exhibit high levels of linearity and may be relatively inexpensive to fabricate. Group III nitride-based RF power amplifiers are typically implemented using High Electron Mobility Transistors ("HEMT") and are primarily used in applications requiring high power and/or high frequency operation where LDMOS RF power amplifiers may have inherent performance limitations.

RF power amplifiers may include one or more amplification stages, with each stage typically implemented as a transistor amplifier. In order to increase output power and current handling capabilities, RF power amplifiers are typically implemented in a "unit cell" configuration in which a large number of individual "unit cell" transistor structures are arranged electrically in parallel. An RF power amplifier may be implemented as a single integrated circuit chip or "die," or may include a plurality of dies. A die or chip may refer to a small block of semiconducting material or other substrate on which electronic circuit elements are fabricated. When multiple RF transistor dies are used, they may be connected in series and/or in parallel.

RF power amplifiers often include matching circuits, such as impedance matching circuits that are designed to improve the impedance match between the active transistor die (e.g., including MOSFETs, HEMTs, LDMOS, etc.) and transmission lines connected thereto for RF signals at the fundamental operating frequency, and harmonic termination circuits that are designed to at least partly terminate harmonics that may be generated during device operation, such as second and third order harmonics. Termination of harmonics also influences generation of intermodulation distortion products.

The RF transistor die(s) as well as the impedance matching and/or harmonic termination circuits may be enclosed in an integrated circuit device package. Integrated circuit packaging may refer to encapsulating one or more dies in a supporting case or package that protects the dies from physical damage and/or corrosion, and supports the electrical contacts for connection to external circuits. The input and output impedance matching circuits in an integrated circuit device package typically include inductor-capacitor (LC) networks that provide at least a portion of an impedance matching circuit that is configured to match the impedance of the active transistor die to a fixed value. The package typically includes an electrically conductive attachment surface or "flange" on which the dies are mounted, and an electrically insulating protective material, such as plastic or ceramic, that seals and protects the dies from moisture and dust particles. Electrically conductive leads (also referred to herein as package leads or RF leads) may extend from the package, and are used to electrically connect the RF transistor amplifier to external circuit elements such as input and output RF transmission lines and bias voltage sources.

As noted above, Group III nitride-based RF power amplifiers are often used in high power and/or high frequency applications. Typically, high levels of heat are generated within the Group III nitride-based RF transistor die(s) during operation. If the RF transistor die(s) become too hot, the performance (e.g., output power, efficiency, linearity, gain, etc.) of the RF transistor amplifier may deteriorate and/or the RF transistor die(s) may be damaged. As such, Group III nitride-based RF power amplifiers are typically mounted in packages that may be optimized for heat removal.

In some package designs, the flange of the package includes a thermally conductive substrate, also referred to herein as a "heat slug" or "heat sink." A package level heat slug is designed to pull heat away from the integrated circuits and toward an external heat sink. Typically, the heat slug is formed from a thermally conductive material (e.g., metal). In some package configurations, the heat slug also serves as an electrical terminal that provides a reference potential (e.g., ground) to the dies that are mounted thereon. For example, the flange may be a CPC (copper, copper-molybdenum, copper laminate structure) or copper flange that provides both an attachment surface for the dies and a heat slug.

One semiconductor package design is a molded design (or "overmold" package), in which a plastic or other non-conductive encapsulant material is molded (e.g., by injection or transfer molding) directly on to the heat slug to form a solid structure that directly contacts and encapsulates the RF transistor dies and/or other integrated circuits and associated electrical connections as well as at least part of the heat slug.

Another semiconductor package design is an "open-air cavity" or "open cavity" package, in which a (typically ceramic) lid is placed and attached over a metal heat slug. The ceramic lid seals an open-air cavity that includes the RF transistor dies and/or other integrated circuits and associated electrical connections.

FIG. 1A is a schematic side view of a conventional open cavity RF power amplifier package 170 (illustrated by way of example as a thermally enhanced package) including a transistor die 110 and matching circuits (illustrated by way of example as chip capacitors 190, 192) attached to an electrically conductive attachment surface or flange provided by a package submount 176. The open cavity package 170 includes a lid member 179 (e.g., a ceramic lid, such as alumina) and sidewall members (e.g., printed circuit board (PCB) 177) on the submount 176. The lid 179 and sidewalls of the PCB 177 seal an open-air cavity that includes the transistor die 110 and/or other integrated circuits and associated electrical connections 125, also referred to herein as components of the package. In the example of FIG. 1A, the PCB 177 provides a "window frame" 175 around the components, and supports conductive layers or traces 173 (e.g., copper cladding) that provide the input and output leads 172 and 174.

FIG. 1B is a schematic side view of the package 170 of FIG. 1A mounted on a RF circuit board 180. The input and output leads 172 and 174 connect the package 170 to respective conductive layers or traces 183 (e.g., copper cladding) on the structure 187 (e.g., a PCB layer) of the connecting RF circuit board 180, and provide RF signal connections to and from the die 110 via the matching circuits 190 and 192. The RF circuit board 180 includes an opening 181 that is sized to accept the flange 176, such that a bottom surface of the flange 176 may contact a heat sink 186, which may be or may be part of a layer supporting the RF circuit board 180.

SUMMARY

According to some embodiments, a radio frequency (RF) transistor amplifier includes a package submount, and a package frame comprising an electrically insulating member and one or more conductive layers on the package submount. The package frame exposes a surface of the package submount. A transistor die is provided on the surface of the package submount and includes respective terminals that are electrically connected to the package frame. A protective member covers the transistor die. One or more electrical components are attached to the package frame outside the protective member.

In some embodiments, the package frame may not extend substantially beyond edges of the package submount.

In some embodiments, a periphery of the package submount may be free of the protective member.

In some embodiments, the one or more conductive layers of the package frame may define respective leads that provide RF signal connections to the respective terminals of the transistor die and extend outside the protective member.

In some embodiments, the one or more electrical components may be electrically connected to the respective leads outside the protective member.

In some embodiments, the one or more electrical components may define a portion of an input, inter-stage, or output impedance matching circuit or harmonic termination circuit for the RF transistor amplifier.

In some embodiments, the surface of the package submount may be free of portions of the input, inter-stage, or output impedance matching circuit or harmonic termination circuit directly thereon.

In some embodiments, the one or more electrical components may be surface mount devices, and the input or output matching circuit or the harmonic termination circuit may further comprise conductive traces on the package submount to which the surface mount devices are electrically connected.

In some embodiments, the one or more electrical components may not extend directly on or may not directly contact the surface of the package submount.

In some embodiments, the respective terminals of the transistor die may be electrically connected to the respective leads by respective interconnect structures, and the protective member may cover the transistor die and the respective interconnect structures.

In some embodiments, the input, inter-stage, or output impedance matching circuit or harmonic termination circuit may be free of wire bonds.

In some embodiments, the respective leads are free of electrical connections that extend substantially beyond the edges of the package submount.

In some embodiments, the respective leads may be confined within the edges of the package submount.

In some embodiments, one or more conductive surface mount components may be electrically connected to the respective leads and may extend substantially beyond the edges of the package submount.

In some embodiments, the one or more conductive surface mount components may include electrically conductive shims and/or reactive surface mount components.

In some embodiments, the one or more electrical components may include passive and/or reactive surface mount components.

In some embodiments, the protective member may be a dispensed and cured encapsulant extending on the transistor die and at least a portion of the package frame.

In some embodiments, the package frame may be free of a lid member attached thereto.

In some embodiments, the protective member may be a lid member covering the transistor die and at least a portion of the package frame.

In some embodiments, the package submount may be configured to be mounted within an opening in a RF circuit board such that the package frame is confined within the opening.

According to some embodiments, a radio frequency (RF) transistor amplifier, includes a package submount, a package frame comprising an electrically insulating member and one or more conductive layers on the package submount, where the package frame exposes a surface of the package submount, and a transistor die on the surface of the package submount and comprising respective terminals that are electrically connected to the package frame. The package submount is configured to be mounted within an opening in a RF circuit board such that the package frame is confined within the opening.

In some embodiments, the package frame may not extend substantially beyond edges of the package submount. The one or more conductive layers of the package frame may define respective leads that provide RF signal connections to the respective terminals of the transistor die.

In some embodiments, the respective leads of the package frame may be substantially coplanar with a surface of the RF circuit board outside the opening.

In some embodiments, the respective leads may be free of electrical connections that extend substantially beyond the edges of the package submount.

In some embodiments, one or more conductive surface mount components may electrically connect the respective leads to the RF circuit board and may extend substantially beyond the edges of the package submount.

In some embodiments, a protective member may cover the transistor die, and one or more electrical components may be electrically connected to the respective leads and attached to the package frame outside the protective member.

In some embodiments, the one or more electrical components may define a portion of an input, inter-stage, or output impedance matching circuit or harmonic termination circuit for the RF transistor amplifier.

In some embodiments, the respective terminals of the transistor die may be electrically connected to the respective leads by respective interconnect structures, and the protective member may cover the transistor die and the respective interconnect structures.

In some embodiments, the one or more electrical components may be passive and/or reactive surface mount components.

In some embodiments, the protective member may be a dispensed and cured encapsulant extending on the transistor die and at least a portion of the package frame.

In some embodiments, the protective member may be a lid member covering the transistor die and at least a portion of the package frame.

In some embodiments, the amplifier may further include the RF circuit board, wherein the RF circuit board comprises a thermally conductive substrate, and wherein the package submount contacts a surface of the thermally conductive substrate exposed by the opening in the RF circuit board.

According to some embodiments, a radio frequency (RF) transistor amplifier package includes a package submount, a transistor die on a surface of the package submount, and a package frame on a periphery of the surface of the package submount. The package frame includes an electrically insulating member and one or more conductive layers defining respective leads that are electrically connected to respective terminals of the transistor die.

The respective leads are free of electrical connections that extend substantially beyond edges of the package submount.

In some embodiments, the package frame may not extend substantially beyond edges of the package submount, and the respective leads may provide RF signal connections to the respective terminals of the transistor die.

In some embodiments, a protective member may cover the transistor die, and one or more electrical components may be electrically connected to the respective leads and attached to the package frame outside the protective member.

In some embodiments, the one or more electrical components may define a portion of an input, inter-stage, or output impedance matching circuit or harmonic termination circuit for the RF transistor amplifier.

In some embodiments, the respective terminals of the transistor die may be electrically connected to the respective leads by respective interconnect structures, and the protective member may cover the transistor die and the respective interconnect structures.

In some embodiments, the one or more electrical components may be passive and/or reactive surface mount components.

In some embodiments, the protective member may be a dispensed and cured encapsulant extending on the transistor die and at least a portion of the package frame.

In some embodiments, the protective member may be a lid member covering the transistor die and at least a portion of the package frame.

In some embodiments, the package submount may be configured to be mounted within an opening in a RF circuit board such that the package frame is confined within the opening.

In some embodiments, the RF transistor amplifier package may be free of electrical connections that extend beyond the edges of the package submount.

According to some embodiments, a radio frequency (RF) transistor amplifier includes a package submount, a package frame comprising an electrically insulating member and one or more conductive layers on the package submount, where the package frame exposes a surface of the package submount, a transistor die on the surface of the package submount and comprising respective terminals that are electrically connected to the package frame, and a protective encapsulant extending on the transistor die and the package frame.

In some embodiments, the protective encapsulant may be a dispensed and cured encapsulant that covers the transistor die.

In some embodiments, the package frame may not extend substantially beyond edges of the package submount.

In some embodiments, the one or more conductive layers of the package frame may define respective leads that provide RF signal connections to the respective terminals of the transistor die and extend outside the protective encapsulant.

In some embodiments, one or more electrical components may be electrically connected to the respective leads and attached to the package frame outside the protective encapsulant.

In some embodiments, the one or more electrical components may define a portion of an input, inter-stage, or output impedance matching circuit or harmonic termination circuit for the RF transistor amplifier.

In some embodiments, the one or more electrical components may be passive and/or reactive surface mount components.

In some embodiments, the respective leads may be free of electrical connections that extend substantially beyond the edges of the package submount.

In some embodiments, one or more conductive surface mount components may be electrically connected to the respective leads and may extend substantially beyond the edges of the package submount.

According to some embodiments, a method of fabricating a radio frequency (RF) transistor amplifier includes providing a package submount, providing a package frame on the package submount, the package frame comprising an electrically insulating member and one or more conductive layers, where the package frame comprises an opening therein that exposes a surface of the submount, providing a transistor die on the surface of the submount, electrically connecting respective terminals of the transistor die to the package frame, and attaching a protective member to the package submount. The protective member covers the transistor die and exposes a portion of the package frame on a periphery of the package submount. The portion of the package frame has a surface area that is sufficient for population with one or more electrical components.

In some embodiments, the one or more conductive layers of the package frame may define respective leads that provide RF signal connections to the respective terminals of the transistor die and extend along the portions of the package frame.

In some embodiments, the method may further include attaching the one or more electrical components to the portion of the package frame exposed by the protective member, wherein the one or more electrical components are electrically connected to the respective leads.

In some embodiments, the one or more electrical components may define a portion of an input, inter-stage, or output impedance matching circuit or harmonic termination circuit for the RF transistor amplifier.

In some embodiments, the protective member may be a dispensed and cured encapsulant extending on the transistor die and at least a portion of the package frame.

In some embodiments, the method may further include mounting the package submount within an opening in a RF circuit board such that the package frame is confined within the opening.

In some embodiments, the method may further include providing one or more conductive surface mount components electrically connecting the respective leads to the RF circuit board and extending substantially beyond the edges of the package submount.

In some embodiments, the portion of the package frame comprising the respective leads extending therealong may be substantially coplanar with a surface of the RF circuit board outside the opening.

In some embodiments, the transistor die may be a gallium nitride-based high electron mobility transistor (HEMT).

In some embodiments, the transistor die may be a silicon-based laterally diffused metal oxide semiconductor (LDMOS) transistor.

In some embodiments, the transistor die may be configured to operate in at least a portion of one or more of the 2.5-2.7 GHz, 3.4-4.2 GHz, or 5.1-5.8 GHz frequency bands.

In some embodiments, the transistor die may be configured to operate at frequencies above 10 GHz.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

FIG. 5 is a schematic side view of an RF power amplifier package mounted on an RF circuit board, with electrically conductive shims used for package-board connections in accordance with various embodiments of the present disclosure.

FIG. 6 is a schematic side view of an RF power amplifier package mounted on an RF circuit board, with surface mount components used for package-board connections in accordance with various embodiments of the present disclosure.

DETAILED DESCRIPTION

Figure 1A:
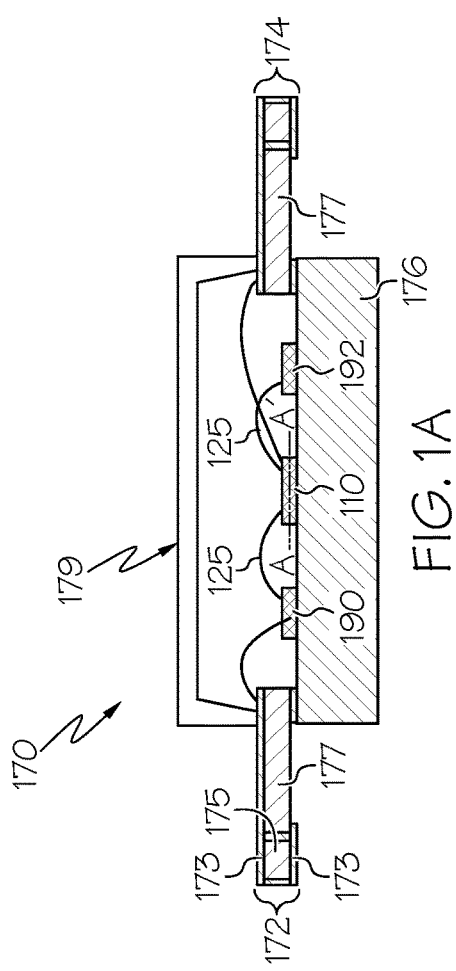
FIG. 1A is a schematic side view of a conventional open cavity RF power amplifier package.
Figure 1B:
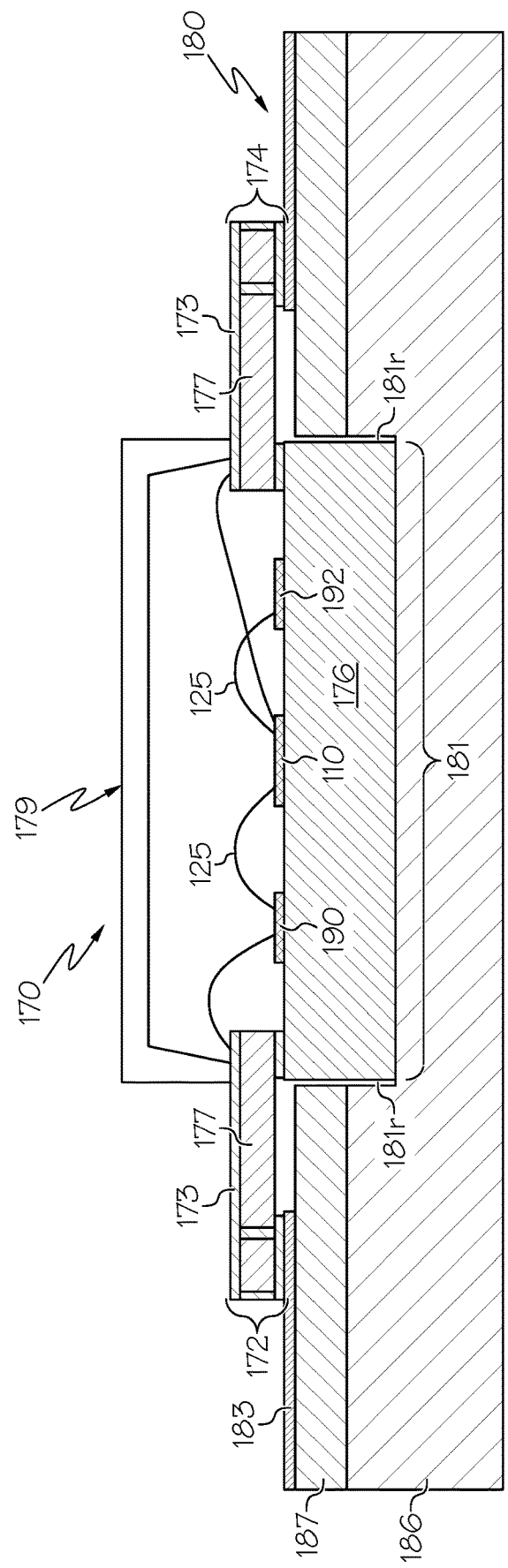
FIG. 1B is a schematic side view of a conventional open cavity RF power amplifier package mounted on an RF circuit board.

Some embodiments of the present disclosure may arise from difficulties that may be presented by existing RF power device package configurations, such as mechanical issues with mounting the package to a RF circuit board. In particular, misalignment of the package leads relative to the conductive traces or conductive top cladding of the RF circuit board, and/or misalignment of the bottom of the package submount relative to the bottom of the opening in the RF circuit board may be problematic. For example, as shown in FIG. 1B, the opening 181 in the RF circuit board 180 may be relatively large in comparison to the dimensions of the submount or flange 176, leaving a gap or ring 181r around the boundary edges of the flange 176 of the package 170. Also, manufacturing variations in the thickness of the flange 176 and/or package PCB 177 may lead to mechanical problems, including misalignment between the top cladding 183 of the RF circuit board 180 and the contact leads 172, 174 of the package 170. As such, it may be difficult to achieve simultaneous contact between the bottom of the flange 176 and the heat sink 186 at the bottom of the opening 181 in the RF circuit board 180, and between the top cladding 183 of the RF circuit board 180 and the package input/output leads 172/174.

Embodiments of the present disclosure provide packaged RF power devices (also referred to herein as RF transistor amplifier packages) including a transistor die and a package frame mounted on a package submount or flange. The package frame may be a structure including one or more electrically insulating members with conductive layers defining patterns, traces, routing, and/or leads thereon, such as a PCB or redistribution layer (RDL) stack). The package submount may be a copper flange or other electrically and/or thermally conductive flange. The package frame may extend on a periphery of the package submount, and may include an internal opening (e.g., cut or otherwise routed into an interior portion of the package frame) that exposes the attachment surface of the package submount and is sized such that the transistor die can make direct contact to the attachment surface of the package submount. The transistor die is electrically connected to the conductive patterns of the package frame, for example, by wire bonds or electrically conductive interconnect structures that extend between respective terminals of the transistor die and the conductive layer(s) of the package frame. The conductive top cladding or other conductive layers of the package frame define respective conductive leads (e.g., input and output leads) that are configured to provide RF signal connections to the transistor die, also referred to herein as RF leads. The conductive leads are free of electrical connections that extend substantially beyond edges of the package surmount.

In some embodiments, the opening in the package frame is covered by a protective member (for example, a ceramic or molded lid, wire cage, plastic overmold, or dispensed and cured encapsulant, such as an epoxy or resin (also referred to as a "glob-top") to protect and/or seal-in the transistor die and electrical connections, while other portions or surfaces of the package frame (including portions of the conductive traces/routing/leads) are exposed, uncovered by, or otherwise free of the protective member. Impedance pre-matching and/or frequency optimization can be achieved using the conductive traces/routing/leads on portions or surfaces of the package frame outside of the protective member, in combination with one or more electrical components (for example, passive and/or reactive surface mount components; also referred to herein as surface mount devices, SMDs) attached or mounted on the portions or surfaces of the package frame outside of the protective member.

For example, the RF transistor amplifier packages described herein may not have a lid as do some conventional open cavity packages, and may not be fully encapsulated in over-mold material like some conventional over-molded packages. In some embodiments, only the opening in the package frame (which exposes the transistor die and wirebonds or other electrical connections on the surface of the submount) is glob-topped or otherwise covered by the protective member to protect the transistor die and/or electrical connections. A remainder of the top surface of the package frame is exposed, similar to a PCB of a RF circuit board. The portion(s) of the package frame outside of the protective member has a surface area that is sufficient for mounting or attaching one or more electrical components thereon. The exposed portions of the package frame can be routed with copper traces and populated with SMD components similar to those of the RF circuit board, for example, to implement matching circuits for the transistor die.

In some embodiments, the package input/output leads and/or other portions of the package frame may be confined within or may not extend substantially beyond edges of the package submount or flange. For example, the RF transistor amplifier package may be sized or otherwise configured such that the package submount can be placed into an opening in an RF circuit board, and the package frame may be confined within the opening. In some embodiments, the top surface (e.g., the conductive top cladding layer) of the package frame may be substantially coplanar or "flush" with the surface (e.g., a conductive top cladding layer) of the RF circuit board outside the opening. That is, the respective leads of the package frame may be substantially coplanar with conductive traces/routing on the surface of the RF circuit board. In some embodiments, electrically conductive (e.g., copper) shims and/or SMDs may be used to electrically connect the RF transistor amplifier package to the RF circuit board.

For example, the RF transistor amplifier package may not have conductive leads or other electrical connections laterally extending outward significantly or substantially beyond the flange, as in some conventional open-cavity or overmold packaged RF devices. In some embodiments, the boundaries of the overall package (including the package frame) are similar to those of the submount or flange. The package may not use the PCB and conductive routing of the package frame for contacting the RF circuit board. Instead, the RF signal connections between the package and the RF circuit board (e.g., a customer or demo circuit board) are implemented by conductive (e.g., copper) shims or SMD components (e.g., RF capacitors, zero-ohm resistors, etc.) that extend beyond the flange, which may be added after assembly and/or sale. Since the conductive shims are flexible, RF transistor amplifier packages according to embodiments of the present disclosure may be more tolerant to misalignment between the top surfaces of the RF circuit board and the package. That is, flexible conductive shims can bend to absorb misalignment between the surfaces of the RF circuit board and package top surfaces while still maintaining good contact for RF signal connections.

In some embodiments of the present disclosure, at least portions of the matching circuits (including impedance pre-matching and/or harmonic termination) that are typically used in high-power RF products can be implemented by the conductive routing (defining the conductive leads and/or traces) and electrical components (including passive and/or reactive surface mount components) on portions or surfaces of the package frame that are exposed by or are otherwise outside of the protective member that covers the transistor die. As such, the electrical components defining portions of the matching circuits are outside of the protective member, and do not extend directly on or do not directly contact the package submount or flange. In contrast, some conventional RF power products use chip capacitors attached directly on the flange and wire bonds with specific profile and lengths to provide the impedance pre-matching. In addition, by exposing the conductive routing and/or other impedance matching components at the top surface of the package frame (similar to the components on a RF circuit board) embodiments of the present disclosure provide package configurations in which the matching circuits can be changed (or fine-tuned) even after the package assembly is completed. That is, in embodiments of the present disclosure, the RF transistor amplifier package can be modified or tuned for different frequency bands (e.g., in virtual broadband applications) after assembly and/or shipment to customers.

In some embodiments, the electrical components attached to the surface of the package frame to define portions of the impedance pre-matching (including input, inter-stage, or output impedance matching circuits) and/or harmonic termination circuits for active transistor dies may be implemented by Integrated Passive Devices (IPDs). IPDs include passive electrical components (e.g., resistors and reactive electrical components, such as inductors and capacitors), and may be fabricated using standard semiconductor processing techniques such as thin film and/or photolithography processing. IPDs can be flip chip mountable or wire bondable components, and may include thin film substrates such as silicon, alumina, or glass, which may allow for ease in manufacturing and packaging with active transistor dies.

In some embodiments, the use of wire bonds in the RF amplifier package may be reduced and/or eliminated. For example, wire bonds may be primarily or only implemented for electrical connectivity from the transistor die to the package frame, such that the shape and/or profile of the wire bonds may be less critical for impedance matching. In some embodiments of the present disclosure, the matching circuits may be free of wire bonds. Also, adapting embodiments for various products or uses may be less complex because a standard low-profile wire bond array may be used, even for package derivatives for use at different frequency bands/power levels etc. That is, as matching circuits may be primarily or entirely implemented by the conductive traces/routing and/or passive/reactive electrical components that are outside of the protective member covering the transistor die and electrical connections, wire bonding can be reduced and/or minimized. In some embodiments, the electrical connections to the transistor terminals may be implemented using IPDs protected by the protective member, instead of wire bonds. For example, copper pillars may be used to connect the transistor terminals to the IPDs, particularly with thinner (e.g., less than about 10 mils or less than about 5 mils) package frames. The reduction in wire bonding can reduce package costs (particularly in the case of gold (Au)

wire bonds). That is, matching circuits implemented primarily or entirely by PCB and SMD-based components may be less costly than high-Q chip capacitors and Au wire-bonding, thus allowing for reduced-cost packages.

Figure 2A:
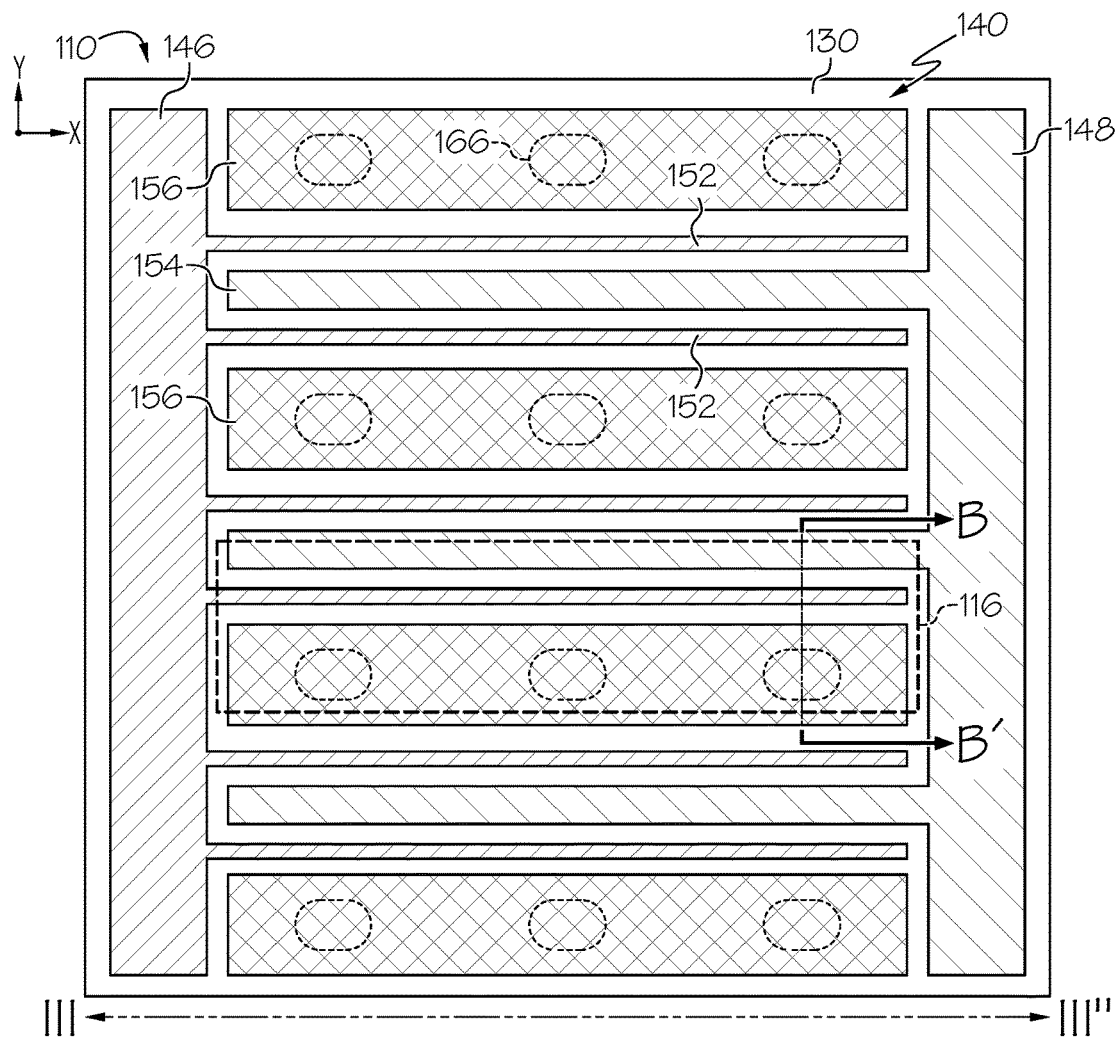
FIG. 2A is a schematic cross-sectional view of a RF transistor die in accordance with various embodiments of the present disclosure.
Figure 2B:
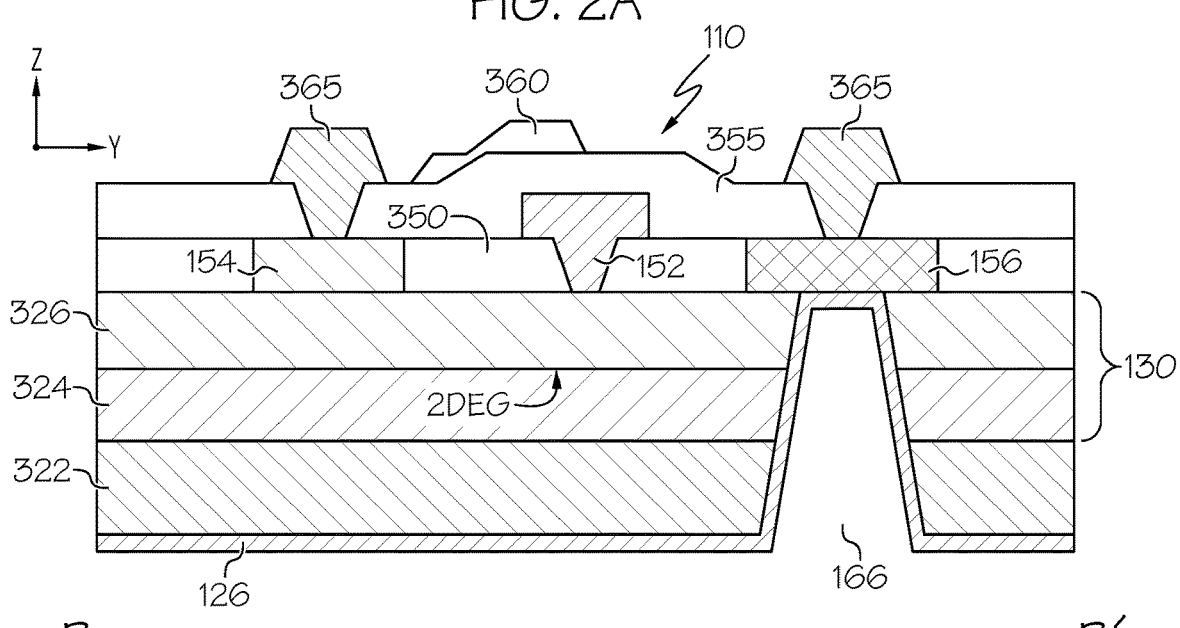
FIG. 2B is a schematic cross-sectional view of an RF transistor die unit cell in accordance with various embodiments of the present disclosure, where the cross-section is taken along line B-B' of FIG. 2A.
Figure 3A:
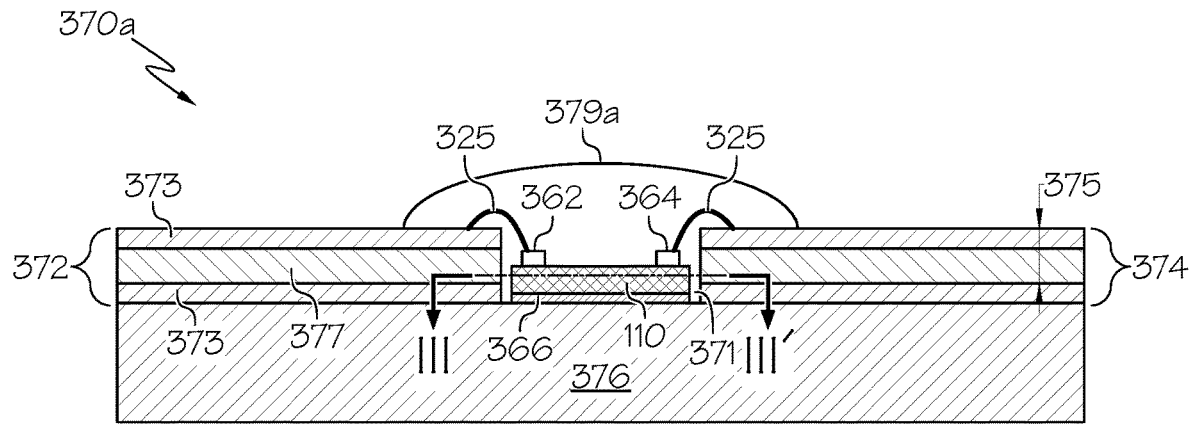
FIGS. 3A, 3B, and 3C are schematic side views of an RF power amplifier package in accordance with various embodiments of the present disclosure.

FIG. 2A is a schematic cross-sectional view of a RF transistor die in accordance with various embodiments of the present disclosure, where the cross-section is taken through a portion of the top side metallization structure of the transistor die 110, e.g., along line III-III' of FIG. 3A. Dielectric layers that isolate the various conductive elements of the top-side metallization structure from each other are not shown in FIG. 2A to simplify the drawing. FIG. 2B is a schematic cross-sectional view of an RF transistor die unit cell in accordance with various embodiments of the present disclosure, where the cross-section is taken along line B-B' of FIG. 2A.

As shown in FIGS. 2A-2B, the RF transistor die 110 is illustrated by way of example as a Group III nitride-based HEMT RF transistor amplifier that has a plurality of unit cell transistors 116, where each unit cell transistor 116 includes a gate finger 152, a drain finger 154 and a source finger 156. It will be appreciated, however, that the RF transistor dies 110 may be implemented in a different technology such as, for example, a silicon LDMOS RF transistor amplifier. The gate fingers 152 are electrically connected to a common gate bus 146, and the drain fingers 154 are electrically connected to a common drain bus 148. The gate bus 146 is electrically connected to the gate terminal (e.g., through a conductive via that extends upwardly from the gate bus 146), which may be implemented as an input contact pad 362 (see FIG. 3A), and the drain bus 148 is electrically connected to the drain terminal 144 (e.g., through a conductive via that extends upwardly from the drain bus 148), which may be implemented as an output contact pad 364 (see FIG. 3A). The source fingers 156 are electrically connected to the source terminal 126 (which may be implemented as a ground contact pad 366) via a plurality of conductive source vias 166 that extend through the semiconductor layer structure 130, as shown in the cross section of FIG. 2B (discussed in detail below). The conductive source vias 166 may be metal-plated vias that extend completely through the semiconductor layer structure 130.

It will be appreciated that FIGS. 2A-2B (and various of the other figures) are highly simplified diagrams and that actual RF transistor dies may include many more unit cells and various circuitry and elements that are not shown in the simplified figures herein. More generally, the figures herein are intended to represent structures for identification and description and are not intended to represent the structures to physical scale.

Figure 3B:
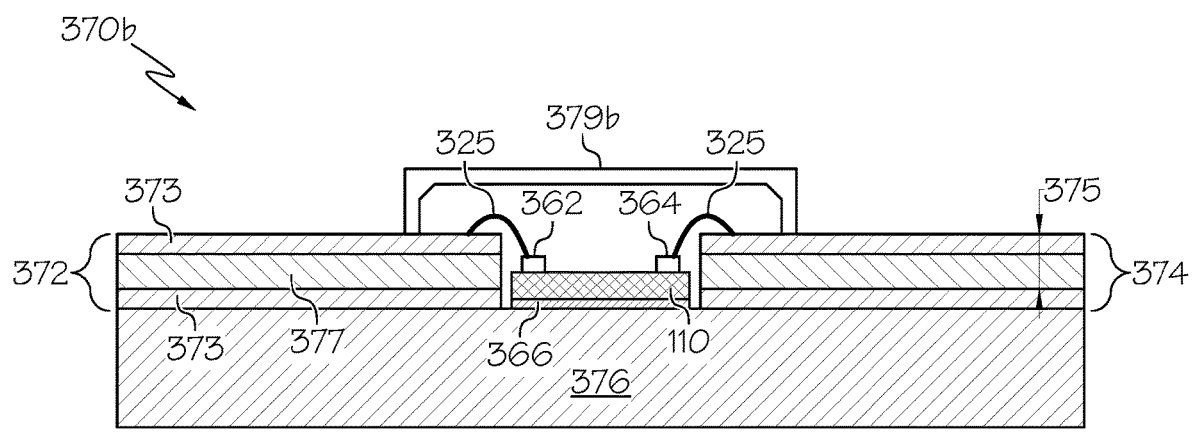
Figure 3C:
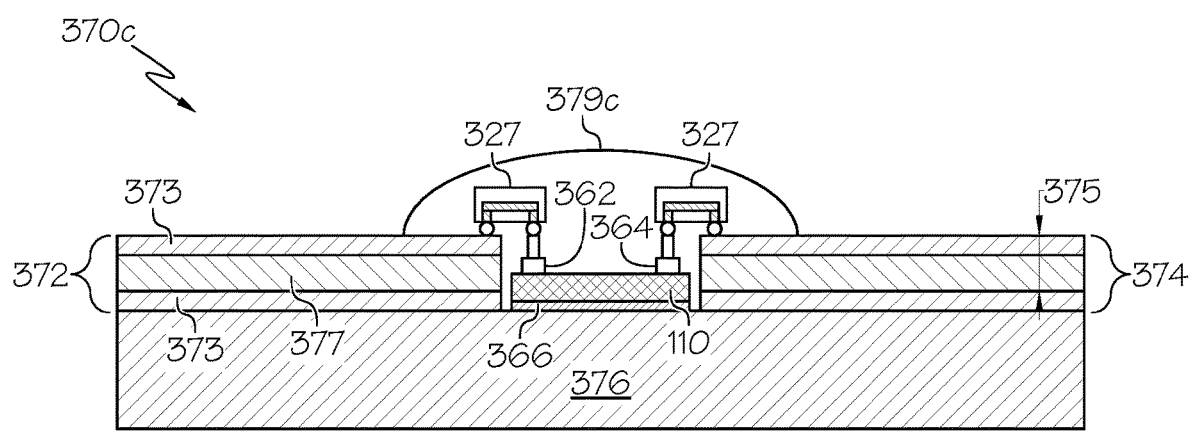

FIGS. 3A, 3B, and 3C are schematic side views of RF transistor amplifier packages 370a, 370b, and 370c, respectively (collectively 370) in accordance with various embodiments of the present disclosure. As shown in FIGS. 3A-3C, one or more transistor dies (e.g., a GaN on SiC transistor die) 110 are attached to a conductive submount 376 (illustrated as an electrically conductive flange). For example, the flange 376 may be a CPC (copper, copper-molybdenum, copper laminate structure) or copper flange that provides both an attachment surface for the transistor die(s) 110 and a heat slug. The transistor die(s) 110 may be attached to the submount 376 with typical die attach materials and/or methods (e.g., gold-tin (AuSn) solder, silver (Ag) sintering, conductive epoxy, etc.). In some embodiments, the transistor die(s) 110 may define a multi-stage amplifier, such as a Doherty amplifier. A package frame 375 is provided on a peripheral region or periphery of the submount 376. The package frame 375 includes an electrically insulating member 377 (e.g., a PCB) and one or more conductive layers or traces 373 (e.g., copper cladding layers or other metallization) that define input and output leads 372 and 374 of the package 370a. The input and output leads 372 and 374 are respective RF leads that provide RF signal connections to the respective terminals 362 and 364 of the transistor die(s) 110. The RF leads 372, 374, may comprise, for example, microstrip transmission lines.

An opening 371 in the package frame 375 exposes a surface of the submount 376 including the transistor die(s) 110 thereon. In some embodiments, the opening 371 is sized to surround the one or more transistor dies 110 attached to the surface of a central region of the submount 376, e.g., providing a window frame around the transistor die(s) 110. The opening 371 in the package frame 375 may be sized slightly larger than the transistor die(s) 110 or surface areas occupied thereby on the submount 376 (e.g., by about 20 mils or less, 15 mils or less, or 10 mils or less) to allow for die-attach material flow-out and placement variations on the transistor die(s) 110. The ground contact pad(s) 366 of the transistor die(s) 110 is/are electrically connected to the conductive submount 376. In FIGS. 3A and 3B, respective wire bonds 325 (illustrated as low-profile wire bonds) electrically connect the input contact pad 362 (e.g., a gate pad) and output contact pad 364 (e.g., a drain pad) of the transistor die(s) 110 to the package frame 375. In FIG. 3C, respective passive interconnect structures 327 (e.g., IPDs) electrically connect the input and output contact pads 362 and 364 of the transistor die(s) 110 to the package frame 375. More generally, an interconnect structure or device 327 (or "integrated interconnect") may refer to a structure that includes integrated circuitry such as resistors (including transmission lines), vias, inductors, and/or capacitors on a layer or substrate, for example, a dielectric base structure with integrated traces, vias and/or circuitry that can be used instead of wire bonds to reduce and/or avoid related parasitic induction and manufacturing issues.

After the interconnection operations (i.e., the formation of the wire bonds 325 and/or the placement of the interconnect structures 327), a protective member 379a, 379b, 379c (collectively 379) is formed or otherwise provided on the opening 371 in the package frame 375 including the transistor die(s) 110. The protective member 379 may encapsulate or otherwise cover the transistor die(s) 110 and the surface of the submount 376 exposed by the package frame 375, while leaving peripheral portions of the package frame 375 (and the conductive layers 373 thereon) exposed or otherwise free of the protective member 379.

For example, as shown in FIGS. 3A and 3C, the protective member 379 may be an encapsulant 379a, 379c (e.g., a plastic over mold (OMP)) that encapsulates or otherwise provides protection for the die(s) 110 while exposing or otherwise providing access to the remainder of the package frame 375. For example, the opening 371 in the package frame 375 may be sealed or "glob-topped" (e.g., using a dispensed and cured encapsulant 379a that may typically be used on PCBs) to protect the transistor die(s) 110 and electrical connections 325, 327. In some embodiments, the glob-top encapsulant 379a may be molded and/or shaped prior to curing. As another example, as shown in FIG. 3B, the protective member 379 may be a lid member 379b that is placed and attached over the transistor die(s) 110 and electrical connections 325 to define an open-cavity covering, for example, a ceramic material (e.g., alumina). In yet other examples, the protective member 379 may be a wire-based structure, such as a wire cage, or a molded or shaped lid structure. More generally, any combination of dielectric and/or conductive materials may be used to form the protective member 379 covering the opening 371 and the transistor die(s) 110, while exposing portions of the conductive routing provided by the conductive layer(s) 373 outside of the protective member 379.

The package frame 375 may be any substrate or laminate including an insulating layer 377 and one or more conductive layers 373 (e.g., traces, vias, routing patterns) that can be attached to or otherwise formed on the conductive flange or submount 376. For example, in some embodiments the package frame 375 may include a PCB 377 made of board materials (e.g., RO4003C Lo pro, Isola Astra MT77, etc.) with low loss at RF frequencies, and can have a thickness ranging from about 3 mils to about 40 mils. The package frame 375 may be capable of withstanding the high temperatures used during board attach (and subsequent passive/reactive component attach, as described below) or RF operation of the packaged device 370. While illustrated as including two conductive layers 373 (conductive top cladding and conductive bottom cladding) on an electrically insulating member 377, the package frame 375 can include fewer or more layers (e.g., a multi-layer circuit board including, for example, 5 layers, 8 layers, etc.) with conductive vias connecting different conductive layers 373. In some embodiments, the package frame 375 may further include embedded capacitance layers, with the conductive layers 373 outside of the protective member 379 electrically connected thereto.

The outer extent or periphery of the package frame 375 may be dimensionally similar to the outer extent of the flange or submount 376. That is, the package frame 375 may not extend significantly outward or substantially beyond the edge of the flange 376. For example, in some embodiments the package frame 375 may be confined within the edges of the flange 376, e.g., within less than about 15 mils from the edges of the flange, for example, within about 10 mils or less, or within about 5 mils or less. In some embodiments, the package frame 375 may extend beyond the edges of the flange 376, e.g., by less than about 15 mils, for example, by about 10 mils or less, or by about 5 mils or less. Tolerances of a PCB-based package frame 375 may be less than about 3 mils in some embodiments. More generally, the periphery of the package frame 375 may be within about ±15 mils (e.g., about ±10 mils, about ±5 mils, or less) of the edges of the submount 376.

The packaged RF power device 370 may thus be free of electrical components and/or electrical connections that extend substantially beyond the flange or submount 376. In addition, portions of the conductive layer(s) 373 outside of the protective member 379 can be patterned and routed to provide an appropriate or desired RF function or circuit (e.g. impedance pre-matching, frequency filtering, etc.). The impedance and/or frequency response of this matching circuitry may also be reconfigured after assembly, for example, by replacing one or more of the surface mount or other passive/reactive components that are on portions of the package frame 375 exposed by or free of the protective member 379.

Figure 4A:
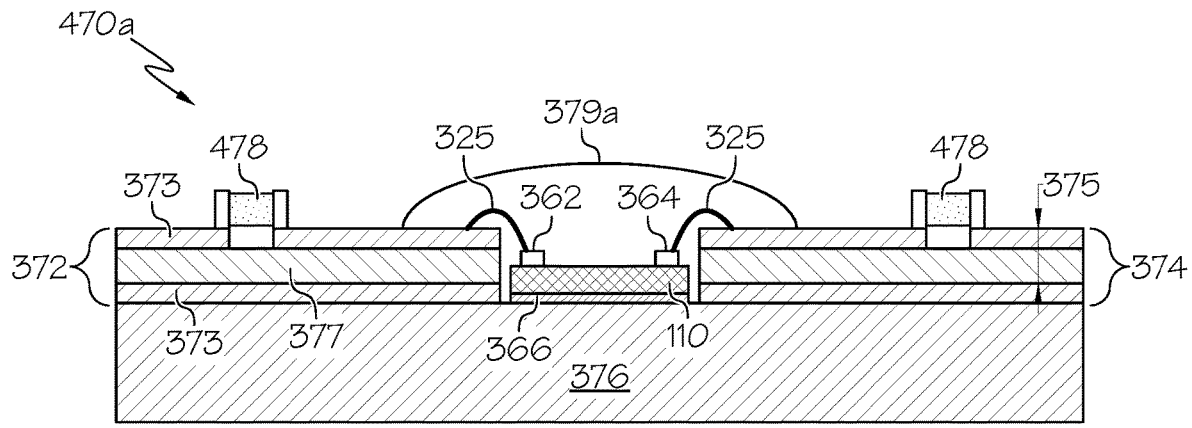
FIG. 4A, 4B, and 4C are schematic side views of an RF power amplifier package including surface mount components on an exposed surface of the package in accordance with various embodiments of the present disclosure.
Figure 4B:
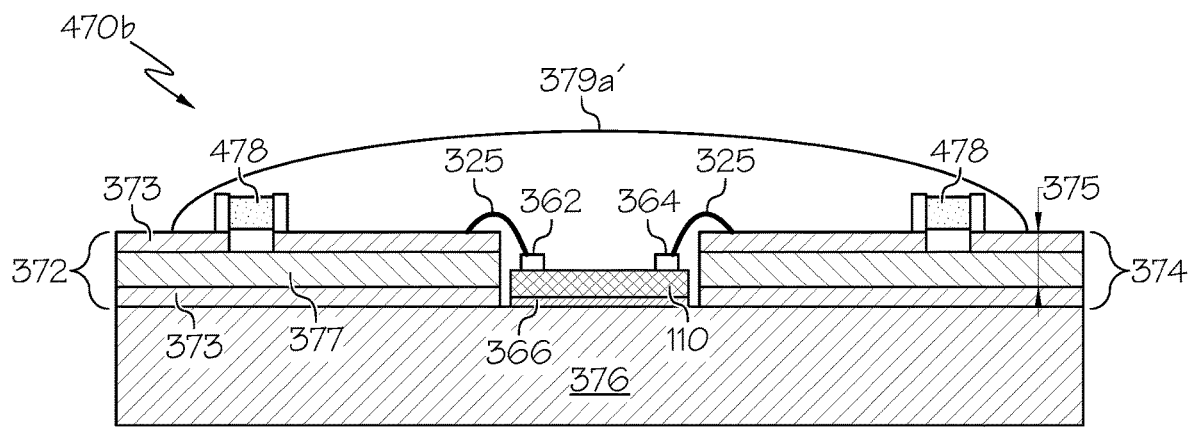
Figure 4C:
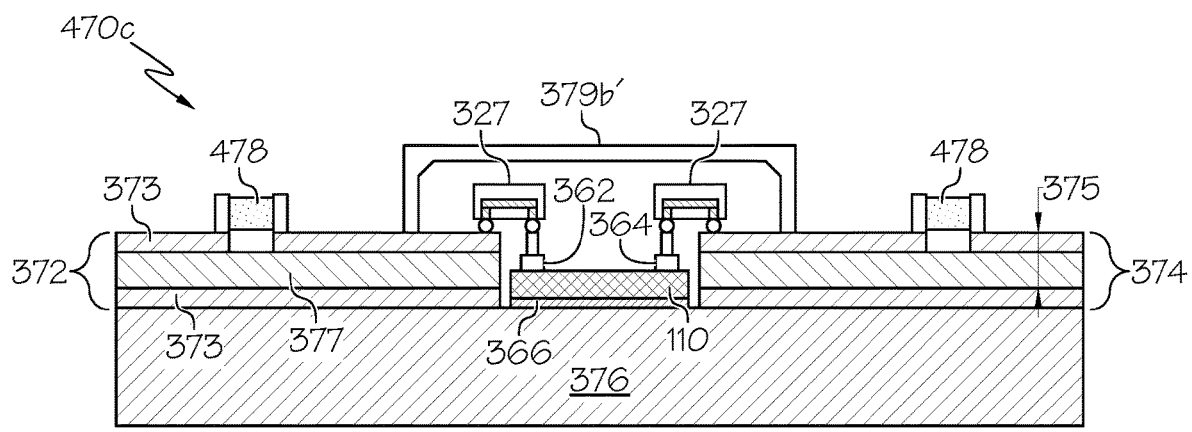

FIGS. 4A, 4B, and 4C are schematic side views of RF transistor amplifier packages 470a, 470b, and 470c, respectively (collectively 470) including passive and/or reactive electrical components (illustrated as SMDs) on the package frame in accordance with various embodiments of the present disclosure. The packages 470 of FIGS. 4A-4C may be similar to the packages 370 of FIGS. 3A-3C, and may further include passive and/or reactive surface mount electrical components 478 (e.g., multi-layer capacitors, inductors, resistors, or other interconnect structures, including IPDs) attached (e.g., by solder, conductive epoxy, etc.) and electrically connected to the conductive leads and/or traces provided by conductive layer 373 on a top surface of the package frame 375.

In FIGS. 4A and 4C, the electrical components 478 are provided on portions of the package frame 375 that are outside of a protective member 379a, 379b' (collectively 379). In particular, in FIG. 4A, the protective member 379 is illustrated as an encapsulant 379a that extends (e.g., conformally) on the transistor die(s) 110, the wire bonds 325, and in some instances on the surface of the submount 376. In FIG. 4C, and the protective member 379 is illustrated as a lid member 379b' that covers the transistor die(s) 110, the interconnect structures 327, and the surface of the submount 376 with an open-cavity configuration. In FIG. 4B, the protective member 379 is illustrated as a dispensed and cured encapsulant 379a' (e.g., a glob-top) that conformally extends on the transistor die(s) 110, the wire bonds 325, and the surface of the submount 376, and further conformally extends on the electrical components 478. More generally, as noted above, the protective member 379 may include any combination of dielectric and/or conductive materials covering the opening 371 and the transistor die(s) 110, while exposing at least a portion of the conductive routing provided by the conductive layer(s) 373 outside of the protective member 379.

In FIGS. 4A-4C, the electrical components 478 are illustrated as SMD components by way of example, but are not limited thereto. The SMD components may include, but are not limited to capacitors, resistors, inductors, and/or other surface-mountable elements. The electrical components 478 are reconfigurable to provide desired impedance characteristics (e.g., to implement input/inter-stage/output impedance matching circuits and/or harmonic termination circuits for the transistor die(s) 110) and/or frequency performance, either before or after shipment of the packaged RF power device 470 to a customer. The protective member 379 protects the die(s) 110 and electrical connections 325, 327 during surface work and/or re-work of the circuit board 377. While FIGS. 4A-4C illustrate embodiments 470a-470c with SMD components 478 attached on the top-side cladding 373 of the package frame 375, but it will be understood that other configurations may be used. For example, in some embodiments, the package frame 375 may be a multi-layer circuit board including multiple electrically insulating layers 377 and conductive layers 373, and the electrical components 478 may be implemented as inter-layer components, such as planar inductors and/or multi-layer capacitors, embedded within one or more layers of the multi-layer circuit board.

FIGS. 5 and 6 are schematic side views of an RF transistor amplifier package 370, 470 mounted on an RF circuit board 500, 600, with electrically conductive surface mount components 585, 678 used for package-board connections in accordance with various embodiments of the present disclosure. As shown in FIGS. 5 and 6, the RF circuit board 500 includes a PCB 587 having one or more conductive layers 583 attached on top of a thermally conductive substrate or heat sink 586 (e.g., a copper or aluminum block or base structure). The heat sink 586 also serves as ground for the RF signals traveling through the RF circuit board 500. A pocket may be machined into the heat sink 586 so that after placement of the packaged RF device, the package submount 376 and the package frame 375 are confined within the opening 581 in the RF circuit board 500 or PCB 587. In some embodiments, a surface (e.g., conductive top cladding layer 373) of the package frame 375 of the packaged device 370, 470 is substantially coplanar or flush with a surface (e.g., conductive top cladding 583) of the RF circuit board 500 or PCB 587. For example, the upper or top surface of the package frame 375 may be within a distance D of about 15 mils (e.g., within about 10 mils, within about 7 mils, within about 5 mils, or less) above or below the top surface of the RF circuit board 500 or PCB 587.

The opening 581 may have dimensions sized to accept the packaged device 370, 470 with some clearance or gap G (e.g., less than about 15 mils, for example, about 10 mils or less, or about 5 mils or less) between the sidewalls of the opening 581 and the periphery or edges of the packaged device 370, 470. In some instances, it may be desirable to justify the packaged device 370, 470 to the left or to the right of the center of the opening 581 (e.g., to be flush or in contact with the PCB 587 on one side). For example, the packaged device 370, 470 may be justified toward the output leads 374, with a gap G of about 30 mils or less (e.g., about 15 mils or less, or about 10 mils or less) between the periphery or edges of the packaged device 370, 470 and the input lead 372, or vice versa. In other instances, the packaged device 370, 470 may be substantially centered in the opening 581, for example, with respective gaps G of about 15 mils or less (e.g., about 10 mils or less, or about 5 mils or less) on either side (e.g., at the input side and the output side, for connection to the input lead 372 and the output lead 374, respectively).

As shown in FIGS. 5 and 6, conductive surface mount components 585, 678 can be used to bridge the connection between the RF circuit board 500 and the conductive leads 372, 374 of the packaged device 370, 470. In particular, in FIG. 5, the conductive surface mount components are implemented by conductive shims 585 (e.g. copper shims) or other flexible conductive materials. For example, in some embodiments the conductive shims 585 may be implemented by copper tape, which may have sufficient flexibility to provide a conductive bridge between the top conductive layer 583 of the RF circuit board 500 and the top conductive layer 373 providing the leads 372, 374 of the packaged RF power device 370, 470, with as much as about ±15 mils (e.g., about ±10 mils, about ±7 mils, or about ±5 mils) of deflection between substantially coplanar surfaces 583 and 373. The conductive shims 585 can be attached (e.g., soldered) by using the same or similar processes used to attach other electrical components 478 and/or 578 (e.g., SMDs, IPDs, or interconnect structures) to the surface of the frame 375 of the packaged RF power device 370, 470 and/or to the RF circuit board 500, respectively.

FIG. 6 illustrates that the conductive surface mount components can be implemented by passive and/or reactive surface mount components 678 used for package-board connections in accordance with various embodiments of the present disclosure. For example, in addition or alternatively to flexible conductive shims 585, other surface mount components 678 (e.g., multi-layer capacitors, inductors, resistors, or other interconnect structures, including IPDs) can be used to provide a conductive bridge between the top conductive layer 583 of the RF circuit board 600 and the top conductive layer 373 providing the leads 372, 374 of the packaged RF power device 370, 470. The conductive surface mount components 678 may otherwise be similar to the passive and/or reactive electrical components 478 (e.g., multi-layer capacitors, inductors, resistors, or other interconnect structures, including IPDs) attached and electrically connected (e.g., by solder, conductive epoxy, etc.) to the conductive leads and/or traces provided by conductive layer 373 on a top surface of the package frame 375, e.g., outside of the protective member 379.

FIGS. 7, 8, 9, and 10 are schematic perspective views illustrating methods of fabricating an RF power device package 470 in accordance with various embodiments of the present disclosure. FIG. 11 is an enlarged schematic perspective view illustrating connections between the RF transistor amplifier package and the RF circuit board of FIG. 10. It will be understood that the fabrication operations shown in FIGS. 7, 8, 9, and 10 are by way of example, and that methods of fabricating the RF power device packages as described herein are not limited to these operations or the order shown.

Figure 7:
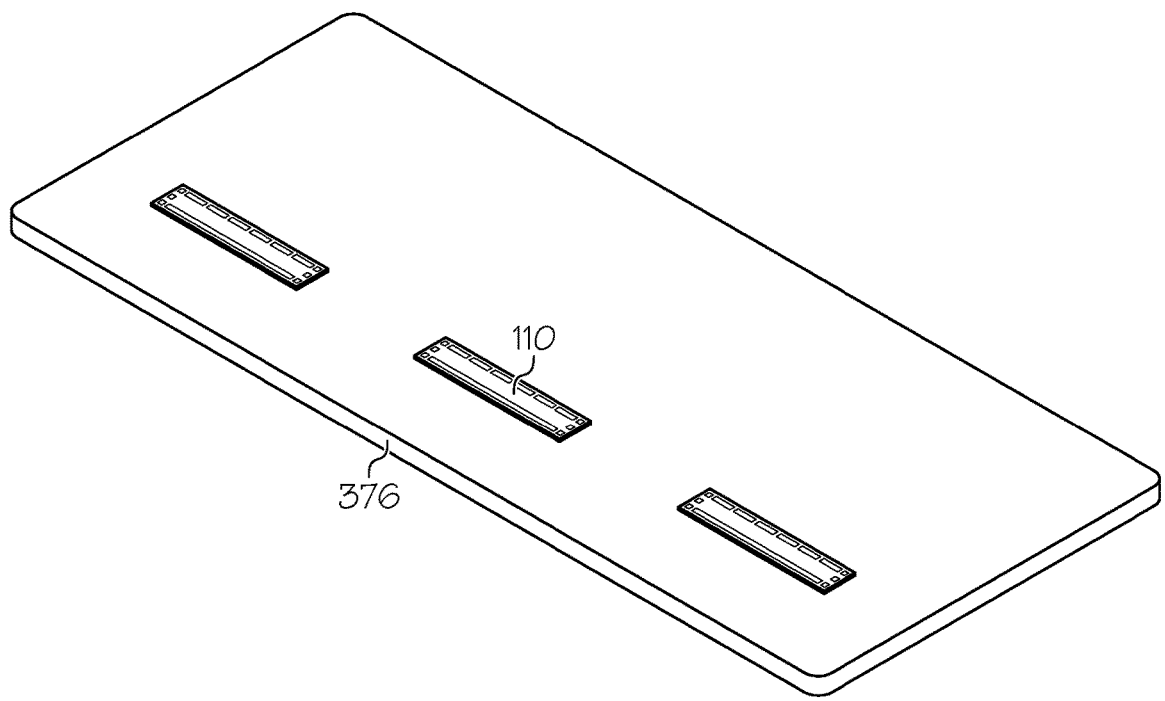
FIGS. 7, 8, 9, and 10 are schematic perspective views illustrating methods of fabricating an RF power amplifier package in accordance with various embodiments of the present disclosure.
Figure 8:
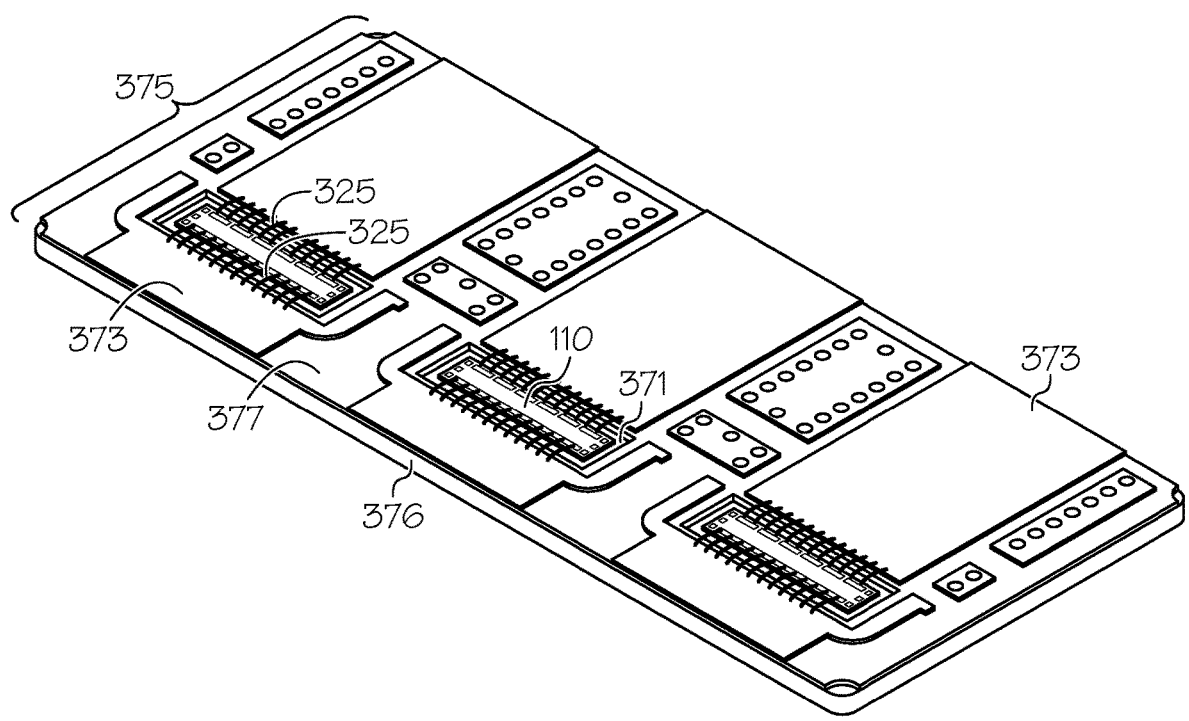

FIGS. 7 and 8 illustrate image of the packaged RF power device 470 at intermediate points during the fabrication or assembly process. In particular, as shown in FIG. 7, transistor dies 110 are attached to a surface of a conductive submount or flange 376. In FIG. 8, a package frame 375 including a PCB dielectric layer 377 and one or more conductive layers 373 are attached to the flange 376. The package frame 375 may be formed on the flange 376 before attachment of the transistor dies 110 in some embodiments. The package frame 375 includes respective openings 371 that expose surfaces of the flange 376 and the transistor dies 110 thereon. The transistor dies 110 are electrically connected to the package frame 375, as illustrated by wire bonds 325. More particularly, respective input (e.g., gate) terminals and output (e.g., drain) terminals of the transistor dies 110 are electrically connected by the wire bonds 325 to respective leads defined by the conductive layer 373 of the package frame 375.

Figure 9:
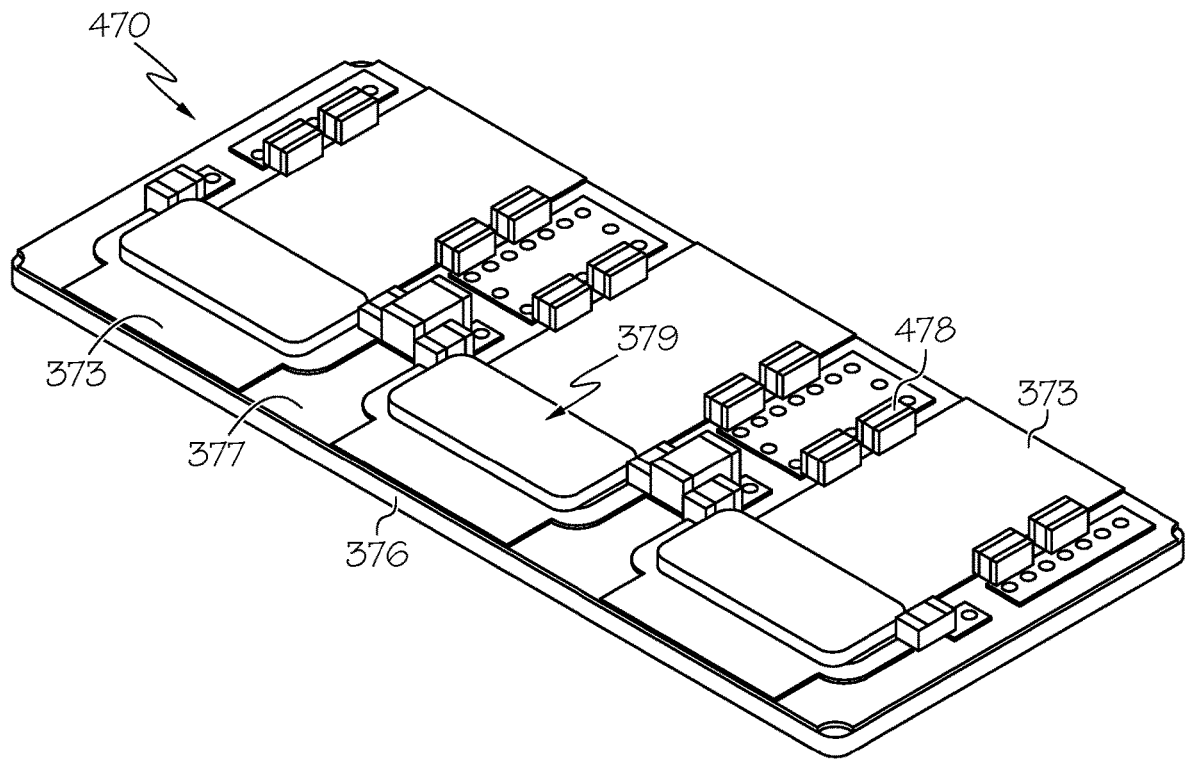

FIG. 9 illustrates completion of the assembly process of the packaged RF power device 470. As shown in FIG. 9, the dies 110 and electrical connections 325 between the dies 110 and the package frame 375 are covered by a protective member 379. For example, the dies 110 and electrical connections 325 may be covered by a conformal encapsulant (e.g., glob-topped with a suitable mold compound to protect the wire and chips) or by an open-cavity lid member. Other portions of the package frame 375 and the conductive traces/routing defined by the conductive layer 373 are exposed by the protective member 379, e.g., on a periphery of the flange 376. The portion(s) of the package frame 375 outside the protective member 379 define a surface area that is sufficient for population with one or more electrical components.

FIG. 9 further illustrates that passive and/or reactive electrical components 478 are attached to the package frame 375 outside of the protective member 379. However, as the conductive traces/routing on the portions of the package frame 375 outside of the protective member 379 are exposed, it will be understood that population with the electrical components 478 may be performed subsequently, for example, after placement onto or mounting into an RF circuit board.

Figure 10:
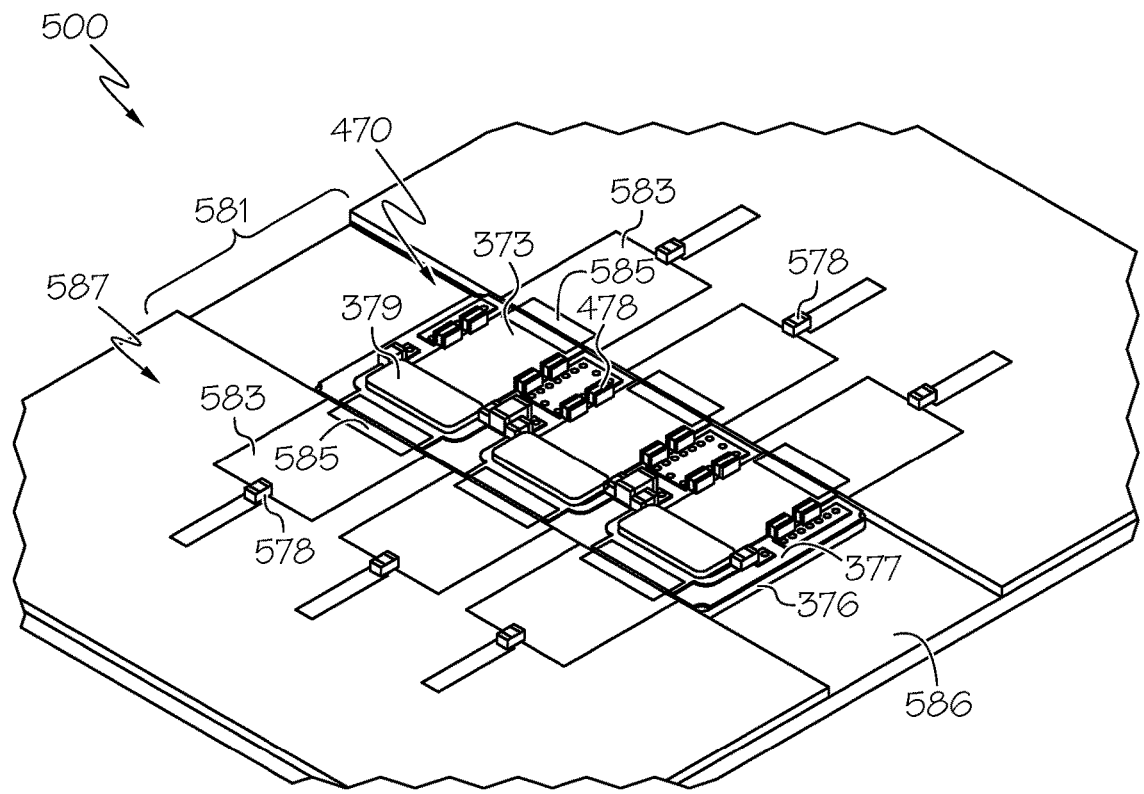
Figure 11:
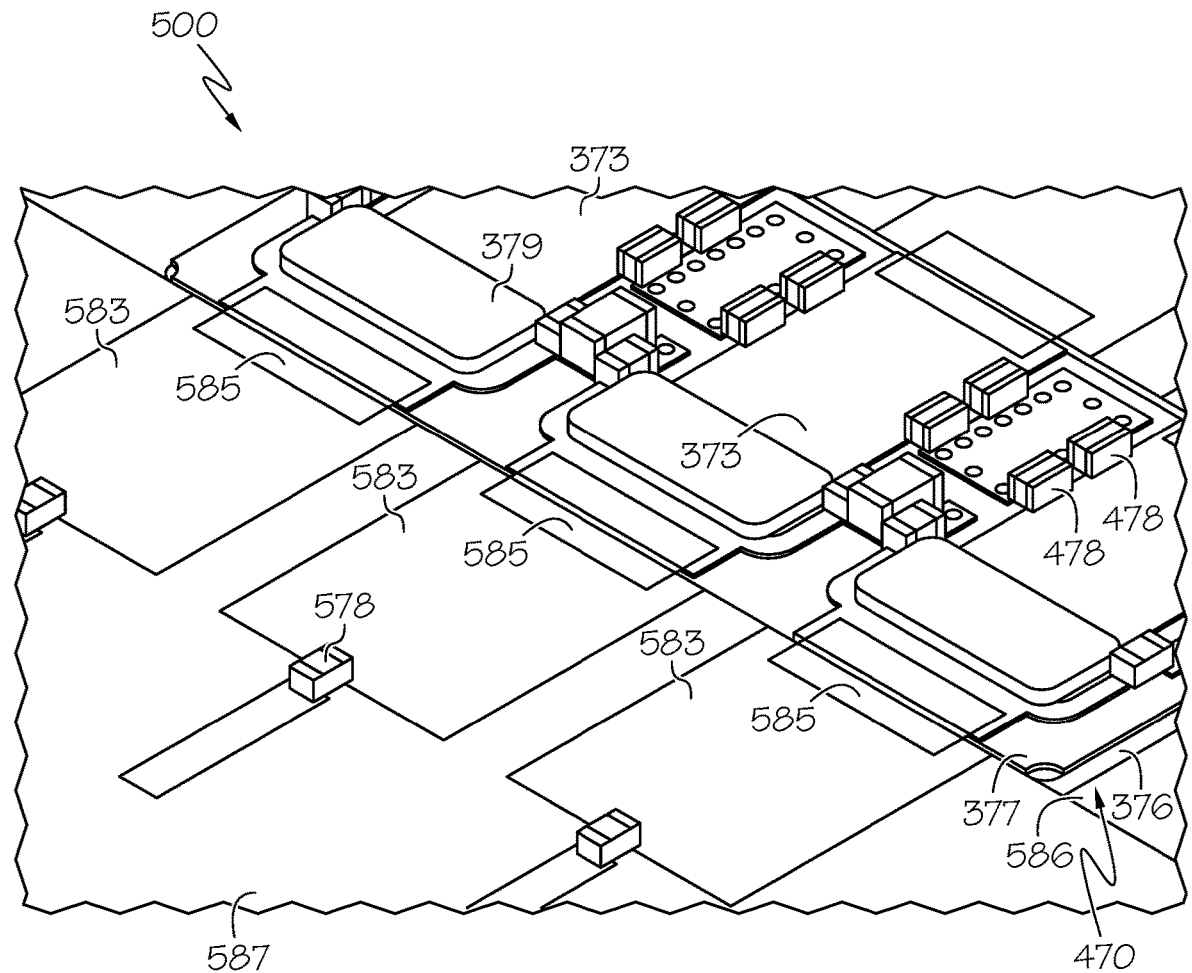
FIG. 11 is an enlarged schematic perspective view illustrating package-board connections between the RF power amplifier package and the RF circuit board of FIG. 10.

FIG. 10 illustrates mounting and electrical connection of the packaged RF power device 470 into an RF circuit board 500. The RF circuit board includes a conductive base structure 586 (e.g., a copper or aluminum heat sink) with electrically insulating 587 and conductive layers 583 thereon. Additional surface mount electrical components 578 (e.g., passive and/or reactive SMDs, IPDs, or interconnect structures) may be provided on the conductive traces/routing provided by the conductive layer(s) 583 of the RF circuit board 500. The packaged RF power device 470 is mounted within an opening 581 in an RF circuit board 500 such that the flange 376 contacts the conductive base structure 586, and such that the package frame 375 is confined within the opening 581. The respective leads defined by the conductive layer 373 of the package frame 375 are free of electrical connections that extend beyond edges of the flange 376.

FIG. 11 illustrates package-board connections between the packaged RF power device 470 and the RF circuit board 500 of FIG. 10 in greater detail. As shown in FIG. 11, conductive surface mount components 585 (e.g., copper shims or other flexible conductive material) are used to provide a conductive bridge between the conductive layer(s) 583 of the RF circuit board 500 and the respective leads provided by conductive layer 373 of the packaged RF power device 470. Additionally or alternatively, surface mount electrical components (e.g., passive and/or reactive SMDs or IPDs; such as the components 678 of FIG. 6) may be used to provide the conductive bridge between the RF circuit board 500 and the packaged RF power device 470.

The packaged RF power devices 370, 470 described herein include a flange 376 and a package frame 375 that are dimensioned to be mounted within the opening 581 in the RF circuit board 500, with conductive leads 373 that are free of electrical connections extending substantially beyond the edges of the flange 376. As such, problems relating to lead contact and/or misalignment of some conventional packaged RF power devices may be reduced and/or avoided. In addition, as the packaged RF power devices 370, 470 may include passive and/or reactive electrical components 478, 585, 678 that are outside of the protective members 379 covering the transistor dies 110 and electrical connections 325 (or are otherwise exposed on a surface of the package frame 375), the electrical components 478, 585, 678 may be reconfigurable to provide desired impedance characteristics (e.g., to implement input/inter-stage/output impedance matching circuits and/or harmonic termination circuits for the transistor die(s) 110) and/or frequency performance, for example, during surface work and/or re-work of the electrical components 578 on the circuit board 500.

Embodiments of the present disclosure may be used in various RF power products, e.g., for 5G and base station applications. Particular embodiments of the present disclosure may be used in massive Multiple Input Multiple Output (mMIMO) (e.g., 1-10 W) active antennas as well as various cellular infrastructure (CIFR) RF power products (including, but not limited to 5 W, 10 W, 20 W, 40 W, 60 W, 80 W and different frequency bands) e.g., for 5G and base station applications, including macro (e.g., 20-80 W and different frequency bands) average power applications. Embodiments of the present disclosure may also be applied to radar and monolithic microwave integrated circuit (MMIC)-type applications.

The RF transistor amplifiers described herein may include transistor die(s) defining gallium nitride-based high electron mobility transistors (HEMTs), and/or defining silicon-based laterally diffused metal oxide semiconductor (LDMOS) transistors. The transistor die(s) may be configured to operate in at least a portion of one or more of the 2.5-2.7 GHz, 3.4-4.2 GHz, or 5.1-5.8 GHz frequency bands, and/or at frequencies above 10 GHz.

Referring again to FIG. 2B, a semiconductor structure 130 that may be used in RF transistor amplifier packages 370, 470 described herein, such as a semiconductor structure for a Group III nitride semiconductor HEMT, may be formed on a substrate 322 such as a silicon carbide substrate, silicon substrate, or a sapphire substrate. The substrate 322 may be a semi-insulating silicon carbide substrate that may be, for example, the 4H polytype of silicon carbide. Other silicon carbide candidate polytypes may include the 3C, 6H, and 15R polytypes. The substrate 322 may be a High Purity Semi-Insulating (HPSI) substrate, available from Cree, Inc. The term "semi-insulating" is used descriptively herein, rather than in an absolute sense.

Although silicon carbide may be used as a substrate material, embodiments of the present application may utilize any suitable substrate, such as sapphire ($Al_2O_3$), aluminum nitride (AlN), aluminum gallium nitride (AlGaN), gallium nitride (GaN), silicon (Si), GaAs, LGO, zinc oxide (ZnO), LAO, indium phosphide (InP), and the like. In some embodiments of the present disclosure, the SiC bulk crystal of the substrate 322 may have a resistivity equal to or higher than about $1 \times 10^5$ ohm-cm at room temperature. The substrate 322 can be a SiC wafer, and the HEMT device can be formed, at least in part, via wafer-level processing, and the wafer can then be diced to provide a plurality of individual HEMTs.

A channel layer 324 is formed on the upper surface 322B of the substrate 322 (or on the optional layers described further herein), and a barrier layer 326 is formed on an upper surface of the channel layer 324. The channel layer 324 and the barrier layer 326 may each be formed by epitaxial growth in some embodiments. Techniques for epitaxial growth of Group III nitrides have been described in, for example, U.S. Pat. Nos. 5,210,051, 5,393,993, and 5,523,589, the disclosures of which are also incorporated by reference herein in their entireties. The channel layer 324 may have a bandgap that is less than the bandgap of the barrier layer 326 and the channel layer 324 may also have a larger electron affinity than the barrier layer 326. The channel layer 324 and the barrier layer 326 may include Group III-nitride based materials.

In some embodiments, the channel layer 324 may be a Group III nitride, such as $Al_xGa_{1-x}N$, where $0 \leq x 21$ 1, provided that the energy of the conduction band edge of the channel layer 324 is less than the energy of the conduction band edge of the barrier layer 326 at the interface between the channel and barrier layers 324, 326. In certain embodiments of the present disclosure, x=0, indicating that the channel layer 324 is GaN. The channel layer 324 may also be other Group III-nitrides such as InGaN, AlInGaN or the like. The channel layer 324 may be undoped ("unintentionally doped") and may be grown to a thickness of greater than about 0.002 μm. The channel layer 324 may also be a multi-layer structure, such as a superlattice or combinations of GaN, AlGaN or the like. The channel layer 324 may be under compressive strain in some embodiments.

With respect to HEMT devices, a 2DEG layer is induced in the channel layer 324 at a junction between the channel layer 324 and the barrier layer 326. The 2DEG layer acts as a highly conductive layer that allows conduction between the source and drain regions of the device that are beneath the source contact 156 and the drain contact 154, respectively. The channel layer 324 and the barrier layer 326 form the semiconductor layer structure 130.

While semiconductor layer structure 130 is shown with channel layer 324 and barrier layer 326 for purposes of illustration, semiconductor layer structure 130 may include additional layers/structures/elements such as a buffer and/or nucleation layer(s) between channel layer 324 and substrate 322, and/or a cap layer on barrier layer 326. HEMT structures including substrates, channel layers, barrier layers, and other layers are discussed by way of example in U.S. Pat. Nos. 5,192,987, 5,296,395, 6,316,793, 6,548,333, 7,544,963, 7,548,112, 7,592,211, 7,615,774, and 7,709,269, the disclosures of which are hereby incorporated herein in their entirety by reference. For example, an AlN buffer layer may be formed on the upper surface of the substrate 322 to provide an appropriate crystal structure transition between the silicon carbide substrate 322 and the remainder of the HEMT device. Additionally, strain balancing transition layer(s) may also and/or alternatively be provided as described, for example, in commonly assigned U.S. Pat. No. 7,030,428, the disclosure of which is incorporated herein by reference as if set forth fully herein.

A source contact 156 and a drain contact 154 may be formed on an upper surface of the barrier layer 326 and may be laterally spaced apart from each other. A gate contact 152 may be formed on the upper surface of the barrier layer 326 between the source contact 156 and the drain contact 154. The material of the gate contact 152 may be chosen based on the composition of the barrier layer 326, and may, in some embodiments, be a Schottky contact.

The source contact 156 may be coupled to a reference signal such as, for example, a ground voltage. The coupling to the reference signal may be provided by a via 166 that extends from a lower surface of the substrate 322, through the substrate 322 to an upper surface of the barrier layer 326. The via 166 may expose a bottom surface of the ohmic portion of the source contact 156. A backmetal layer 126 may be formed on the lower surface of the substrate 322 and on sidewalls of the via 166. The backmetal layer 126 may directly contact the ohmic portion of the source contact 156. Thus, the backmetal layer 126, and a signal coupled thereto, may be electrically connected to the source contact 156.

Still referring to FIG. 2B, the HEMT device 110 may include a first insulating layer 350 and a second insulating layer 355. The first insulating layer 350 may directly contact the upper surface of the semiconductor structure 130 (e.g., contact the upper surface of the barrier layer 326). The second insulating layer 355 may be formed on the first insulating layer 350. It will also be appreciated that more than two insulating layers may be included in some embodiments. The first insulating layer 350 and the second insulating layer 355 may serve as passivation layers for the HEMT device.

The source contact 156, the drain contact 154, and the gate contact 152 may be formed in the first insulating layer 350. In some embodiments, at least a portion of the gate contact 152 may be on the first insulating layer. In some embodiments, the gate contact 152 may be formed as a T-shaped gate and/or a gamma gate, the formation of which is discussed by way of example in U.S. Pat. Nos. 8,049,252, 7,045,404, and 8,120,064, the disclosures of which are hereby incorporated herein in their entirety by reference. The second insulating layer 355 may be formed on the first insulating layer 350 and on portions of the drain contact 154, gate contact 152, and source contact 156.

In some embodiments, field plates 360 may be formed on the second insulating layer 355. At least a portion of a field plate 360 may be on the gate contact 152. At least a portion of the field plate 360 may be on a portion of the second insulating layer 355 that is between the gate contact 152 and the drain contact 154. Field plates and techniques for forming field plates are discussed, by way of example, in U.S. Pat. No. 8,120,064, the disclosure of which is hereby incorporated herein in its entirety by reference.

Metal contacts 365 may be disposed in the second insulating layer 355. The metal contacts 365 may provide interconnection between the drain contact 154, gate contact 152, and source contact 156 and other parts of the HEMT device. Respective ones of the metal contacts 365 may directly contact respective ones of the drain contact 154 and/or source contact 156. The metal contacts 365 may contain metal or other highly conductive material, including, for example, copper, cobalt, gold, and/or a composite metal.

Various embodiments have been described herein with reference to the accompanying drawings in which example embodiments are shown. These embodiments may, however, be embodied in different forms and should not be construed as limited to the embodiments set forth herein. Rather, these embodiments are provided so that this disclosure is thorough and complete and fully conveys the inventive concept to those skilled in the art. Various modifications to the example embodiments and the generic principles and features described herein will be readily apparent. In the drawings, the sizes and relative sizes of layers and regions are not shown to scale, and in some instances may be exaggerated for clarity.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region, or substrate is referred to as being "on," "attached," or extending "onto" another element, it can be directly on the other element or intervening elements may also be present. In contrast, when an element is referred to as being "directly on" or "directly attached" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Elements illustrated by dotted lines may be optional in the embodiments illustrated.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

In the drawings and specification, there have been disclosed typical embodiments of the invention and, although specific terms are employed, they are used in a generic and descriptive sense only and not for purposes of limitation, the scope of the invention being set forth in the following claims.

That which is claimed:

1. A radio frequency (RF) transistor amplifier, comprising:
    a package submount;
    a package frame comprising an electrically insulating member and one or more conductive layers, wherein a first surface of the package frame is on the package submount, wherein the package frame exposes a surface of the package submount;
    a transistor die on the surface of the package submount that is exposed by the package frame and comprising respective terminals that are electrically connected to the package frame
    a protective member covering the transistor die and the surface of the package submount that is exposed by the package frame; and
    one or more surface mount electrical components comprising respective reactive components that are outside the protective member and are attached to a second surface of the package frame that is opposite the first surface,
    wherein the one or more conductive layers of the package frame define respective leads on the second surface of the package frame that are configured to provide input and output RF signal connections from an external device to the respective terminals of the transistor die and extend outside the protective member.

2. The RF transistor amplifier of claim 1, wherein the package frame does not extend substantially beyond outer edges of the package submount and does not extend between the transistor die and the package submount, and wherein the outer edges of the package submount do not extend substantially beyond the package frame.

3. The RF transistor amplifier of claim 1, wherein the one or more surface mount electrical components are electrically connected to the respective leads and are free of a package housing thereon.

4. The RF transistor amplifier of claim 1, wherein the one or more surface mount electrical components define a portion of an input, inter-stage, or output impedance matching circuit or harmonic termination circuit for the RF transistor amplifier on the second surface.

5. The RF transistor amplifier of claim 1, wherein the respective terminals of the transistor die are electrically connected to the respective leads by respective interconnect structures, and wherein the protective member covers the transistor die and the respective interconnect structures.

6. The RF transistor amplifier of claim 1, wherein the respective leads are free of electrical connections that extend substantially beyond outer edges of the package submount.

7. The RF transistor amplifier of claim 1, further comprising:
    one or more discrete conductive surface mount components attached to the second surface of the package frame that laterally extends outside the protective member, electrically connected to the respective leads, and extending substantially beyond outer edges of the package submount.

8. The RF transistor amplifier of claim 1, wherein the protective member comprises a dispensed and cured encapsulant extending on the transistor die and at least a portion of the package frame.

9. The RF transistor amplifier of claim 1, wherein the protective member comprises a lid member covering the transistor die and at least a portion of the package frame.

10. The RF transistor amplifier of claim 1, wherein the package submount is configured to be mounted within an opening in a RF circuit board such that the respective leads on the second surface of the package frame are confined within the opening.

11. A radio frequency (RF) transistor amplifier, comprising:
    a package submount;
    a package frame comprising an electrically insulating member and one or more conductive layers that provide respective leads that are configured to provide input and output RF signal connections on the package submount, wherein the package frame exposes a surface of the package submount; and
    a transistor die on the surface of the package submount and comprising respective terminals that are electrically connected to the respective leads,
    wherein the package submount is configured to be mounted within an opening in a RF circuit board such that the respective leads that are configured to provide the input and output RF signal connections are confined within the opening.

12. The RF transistor amplifier of claim 11, wherein a first surface of the package frame is on the package submount, a second surface of the package frame that is opposite the first surface comprises the respective leads, and the package frame does not extend substantially beyond outer edges of the package submount.

13. The RF transistor amplifier of claim 12, wherein the respective leads of the package frame are substantially coplanar with a surface of the RF circuit board outside the opening.

14. The RF transistor amplifier of claim 12, wherein the respective leads are free of electrical connections that extend substantially beyond the outer edges of the package submount.

15. The RF transistor amplifier of claim 12, further comprising:
    one or more conductive surface mount components attached to the second surface of the package frame that laterally extends outside a protective member that covers the transistor die, electrically connecting the respective leads to the RF circuit board, and extending substantially beyond the outer edges of the package submount.

16. The RF transistor amplifier of claim 15, further comprising the RF circuit board, wherein the RF circuit board comprises a thermally conductive substrate, and wherein the package submount contacts a surface of the thermally conductive substrate exposed by the opening in the RF circuit board.

17. The RF transistor amplifier of claim 12, further comprising:
   a protective member covering the transistor die and the surface of the package submount that is exposed by the package frame; and
   one or more electrical components electrically connected to the respective leads and attached to the package frame outside the protective member.

18. The RF transistor amplifier of claim 17, wherein the one or more electrical components define a portion of an input, inter-stage, or output impedance matching circuit or harmonic termination circuit for the RF transistor amplifier.

19. The RF transistor amplifier of claim 17, wherein the respective terminals of the transistor die are electrically connected to the respective leads by respective interconnect structures, and wherein the protective member covers the transistor die and the respective interconnect structures.

20. The RF transistor amplifier of claim 17, wherein the one or more electrical components comprise reactive surface mount components that are free of a package housing thereon.

21. The RF transistor amplifier of claim 17, wherein the protective member comprises a dispensed and cured encapsulant extending on the transistor die and at least a portion of the package frame.

22. The RF transistor amplifier of claim 17, wherein the protective member comprises a lid member covering the transistor die and at least a portion of the package frame.

23. A radio frequency (RF) transistor amplifier package, comprising:
   a package submount;
   a transistor die on a surface of the package submount; a package frame comprising an electrically insulating member and one or more conductive layers defining respective leads that are electrically connected to respective terminals of the transistor die and are configured to provide input and output RF signal connections to the respective terminals of the transistor die, wherein a first surface of the package frame is on a periphery of the surface of the package submount, and a second surface of the package frame, which is opposite the first surface, comprises the respective leads and is free of a package housing thereon;
   a protective member covering the transistor die, wherein the protective member exposes a portion of the second surface of the package frame; and
   one or more electrical components electrically connected to the respective leads and attached to the second surface of the package frame outside the protective member, wherein the one or more electrical components define a portion of an input, inter-stage, or output impedance matching circuit or harmonic termination circuit for the RF transistor amplifier,
   wherein the respective leads that are configured to provide the input and output RF signal connections are free of electrical connections that extend substantially beyond outer edges of the package submount, and do not extend substantially beyond the second surface of the package frame.

24. The RF transistor amplifier of claim 23, wherein the respective terminals of the transistor die are electrically connected to the respective leads by respective interconnect structures, and wherein the protective member covers the transistor die and the respective interconnect structures.

25. The RF transistor amplifier of claim 23, wherein the package submount is configured to be mounted within an opening in a RF circuit board such that the package frame is confined within the opening.

26. A radio frequency (RF) transistor amplifier, comprising:
   a package submount;
   a package frame comprising an electrically insulating member and one or more conductive layers providing respective leads that are configured to provide input and output RF signal connections from an external device, wherein a first surface of the package frame is on the package submount, wherein the package frame exposes a surface of the package submount;
   a transistor die on the surface of the package submount and comprising respective terminals that are electrically connected to the package frame; and
   a protective encapsulant extending on the transistor die and the package frame; and
   one or more discrete surface mount electrical components electrically connected to at least one of the respective leads, wherein the one or more discrete surface mount electrical components and the respective leads that are configured to provide the input and output RF signal connections are on a second surface of the package frame opposite the first surface and are outside the protective encapsulant.

27. The RF transistor amplifier of claim 26, wherein the one or more discrete surface mount electrical components comprise a conductive shim, a capacitor, or an inductor that are free of a package housing thereon.

28. The RF transistor amplifier of claim 26, wherein the package submount is configured to be mounted within an opening in a RF circuit board such that the respective leads on the second surface of the package frame are confined within the opening.

29. The RF transistor amplifier of claim 26, wherein the one or more discrete surface mount electrical components define a portion of an input, inter-stage, or output impedance matching circuit or harmonic termination circuit for the RF transistor amplifier.

30. The RF transistor amplifier of claim 26, wherein the protective encapsulant comprises a dispensed and cured encapsulant that covers the transistor die.

31. The RF transistor amplifier of claim 26, further comprising:
   one or more conductive surface mount components electrically connected to the respective leads and extending substantially beyond edges of the package submount.

32. A method of fabricating a radio frequency (RF) transistor amplifier, the method comprising:
   providing a package submount;
   providing a first surface of a package frame on the package submount, the package frame comprising an electrically insulating member and one or more conductive layers, wherein the package frame comprises an opening therein that exposes a surface of the package submount;

providing a transistor die on the surface of the package submount;

electrically connecting respective terminals of the transistor die to a second surface of the package frame, which is opposite the first surface; and attaching a protective member to the second surface of the package submount, wherein the protective member covers the transistor die and exposes a portion of the second surface of the package frame on a periphery of the package submount; and providing one or more electrical components comprising respective reactive components outside the protective member and attached to the second surface of the package frame, wherein the one or more conductive layers of the package frame define respective leads on the second surface of the package frame that are configured to provide input and output RF signal connections from an external device to the respective terminals of the transistor die and extend outside the protective member.

* * * * *

UNITED STATES PATENT AND TRADEMARK OFFICE
CERTIFICATE OF CORRECTION

| | |
|---|---|
| PATENT NO. | : 12,100,630 B2 |
| APPLICATION NO. | : 17/097294 |
| DATED | : September 24, 2024 |
| INVENTOR(S) | : Marbell et al. |

It is certified that error appears in the above-identified patent and that said Letters Patent is hereby corrected as shown below:

In the Specification

Column 5, Lines 29-30: Please remove the paragraph break between "transistor die." and "The respective leads"

Column 18, Line 35: Please correct "0≤x21 1," to read --$0 \leq x < 1$,--

In the Claims

Column 21, Line 40, Claim 1: Please correct "the package frame" to read --the package frame;--

Signed and Sealed this
Tenth Day of December, 2024

Katherine Kelly Vidal
*Director of the United States Patent and Trademark Office*